(12) United States Patent
Kwak et al.

(10) Patent No.: US 11,581,393 B2
(45) Date of Patent: Feb. 14, 2023

(54) ELECTRONIC APPARATUS

(71) Applicant: SAMSUNG DISPLAY CO., LTD., Yongin-si (KR)

(72) Inventors: Wonkyu Kwak, Seongnam-si (KR); Jinhee Jang, Gunpo-si (KR); Jae-Sic Lee, Seoul (KR); Minchae Kwak, Seoul (KR); Byungsun Kim, Hwaseong-si (KR); Hansol Kim, Hwaseong-si (KR); Changsoo Pyon, Seongnam-si (KR); Jae Yong Lee, Seongnam-si (KR); Jae-Ho Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/365,966

(22) Filed: Jul. 1, 2021

(65) Prior Publication Data
US 2022/0037451 A1    Feb. 3, 2022

(30) Foreign Application Priority Data

Jul. 31, 2020  (KR) .................. 10-2020-0095829

(51) Int. Cl.
| G09G 3/20 | (2006.01) |
| H01L 27/32 | (2006.01) |
| H01L 51/52 | (2006.01) |
| G09G 3/3266 | (2016.01) |
| G09G 3/3275 | (2016.01) |

(52) U.S. Cl.
CPC ....... *H01L 27/3276* (2013.01); *G09G 3/3266* (2013.01); *G09G 3/3275* (2013.01); *H01L 27/3234* (2013.01); *H01L 51/5256* (2013.01)

(58) Field of Classification Search
CPC . H01L 27/3276; H01L 27/323; H01L 27/326; H01L 27/3237; H01L 27/3234; H01L 51/5256; H01L 51/5237; H01L 51/5281; G09G 3/3275; G09G 3/3225; G09G 3/3266
USPC .......................................................... 345/55
See application file for complete search history.

(56) References Cited

U.S. PATENT DOCUMENTS

| 9,640,681 | B2 | 5/2017 | Min |
| 10,121,406 | B2 | 11/2018 | Jang |
| 10,466,822 | B2 | 11/2019 | Kim et al. |
| 10,607,573 | B2 | 3/2020 | Silvanto et al. |

(Continued)

FOREIGN PATENT DOCUMENTS

| CN | 110062082 | 7/2019 |
| JP | 2010207605 | 9/2010 |

(Continued)

*Primary Examiner* — Jennifer T Nguyen
(74) *Attorney, Agent, or Firm* — F. Chau & Associates, LLC

(57) ABSTRACT

An electronic apparatus includes a base substrate having a first region, a second region at least partially surrounded by the first region, and a display region at least partially surrounding the first region, a plurality of pixels disposed on the base substrate, each of which includes a transistor and a light emitting element connected to the transistor, a hole line connecting pixels with the second region interposed therebetween, and a hole pattern electrically insulated from the hole line, disposed in the first region, and at least partially surrounding the second region.

24 Claims, 20 Drawing Sheets

(56) References Cited

U.S. PATENT DOCUMENTS

| | | | |
|---|---|---|---|
| 10,802,537 B2 | 10/2020 | Ahn et al. | |
| 2010/0109993 A1 | 5/2010 | Chang | |
| 2018/0315885 A1 | 11/2018 | Jeon et al. | |
| 2019/0248018 A1 | 8/2019 | Rho et al. | |
| 2019/0285954 A1* | 9/2019 | Yoshida | G06F 3/04164 |
| 2020/0110495 A1* | 4/2020 | Han | G06F 3/0443 |
| 2020/0176657 A1* | 6/2020 | Jang | H01L 27/3276 |
| 2021/0036022 A1* | 2/2021 | Han | G02F 1/136286 |
| 2021/0343823 A1* | 11/2021 | Tanaka | G09F 9/30 |

FOREIGN PATENT DOCUMENTS

| | | |
|---|---|---|
| KR | 10-2013-0122867 | 11/2013 |
| KR | 10-1490485 | 2/2015 |
| KR | 10-2015-0043889 | 4/2015 |
| KR | 10-2016-0053376 | 5/2016 |
| KR | 10-2017-0014836 | 2/2017 |
| KR | 10-2017-0137230 | 12/2017 |
| KR | 10-2018-0042351 | 4/2018 |
| KR | 10-2018-0063633 | 6/2018 |
| KR | 10-2019-0023008 | 3/2019 |
| KR | 10-1991338 | 6/2019 |
| KR | 10-2031654 | 10/2019 |

* cited by examiner

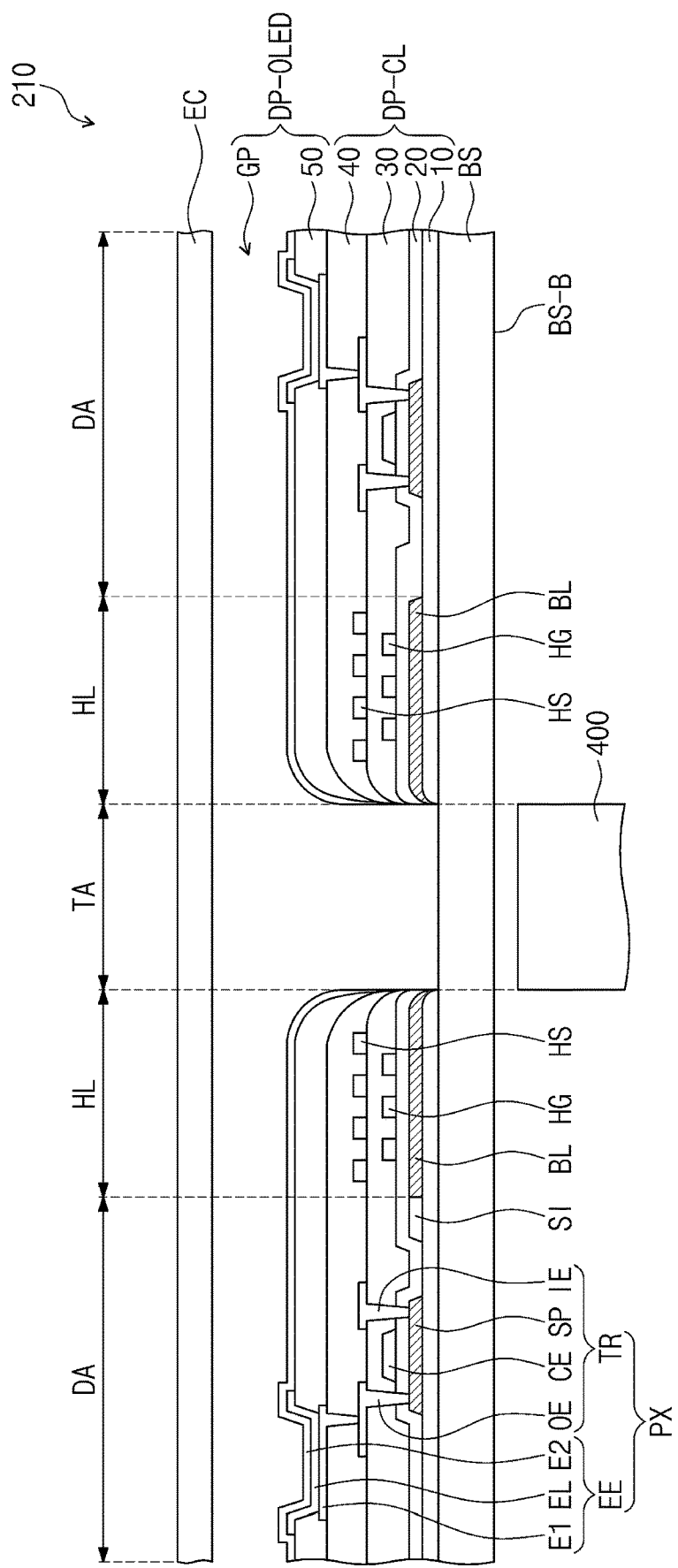

ELECTRONIC APPARATUS

CROSS-REFERENCE TO RELATED APPLICATIONS

This U.S. non-provisional patent application claims priority under 35 U.S.C. § 119 of Korean Patent Application No. 10-2020-0095829, filed on Jul. 31, 2020, the entire contents of which are hereby incorporated by reference.

TECHNICAL FIELD

The present disclosure herein relates to an electronic apparatus, and more particularly, to an electronic apparatus that includes pixels and a hole pattern.

DISCUSSION OF THE RELATED ART

Electronic devices may include various components such as an electronic panel and an electronic module. The electronic panel may include a display unit displaying an image and/or a sensing unit sensing an external input. The electronic components may be electrically connected to each other by signal lines arranged in various manners.

The display unit may include light emitting elements which may be used to generate an image. The sensing unit may include sensors sensing the external input.

SUMMARY

An electronic apparatus includes a base substrate including a first region, a second region at least partially surrounded by the first region, and a display region at least partially surrounding the first region. A plurality of pixels is disposed on the base substrate and each of the plurality of pixels includes a circuit element layer having a transistor and a display element layer having a light emitting element connected to the transistor. A plurality of hole lines connect the pixels. The second region is interposed between neighboring pixels. A hole pattern is electrically insulated from the hole line, is disposed in the first region, and at least partially surrounds the second region.

Each of the pixels may receive a power voltage and may be connected to a scan line transmitting a scan signal and to a data line transmitting a data signal.

The electronic apparatus may further include a hole pattern control unit receiving the power voltage and provide a hole pattern signal to the hole pattern in response to the scan signal.

The hole pattern control unit may include a hole pattern transistor including a first electrode receiving the power voltage, a second electrode outputting the hole pattern signal, and a gate electrode receiving the scan signal.

The hole pattern control unit may include a first hole pattern transistor including a first electrode receiving the power voltage, a second electrode connected to a first node, and a first gate electrode receiving the scan signal. At least one second hole pattern transistor may include a third electrode connected to the first node, a fourth electrode connected to a second node and outputting the hole pattern signal, and a second gate electrode connected to the first node. At least one third hole pattern transistor includes a fifth electrode connected to the second node, a sixth electrode connected to the first node, and a third gate electrode connected to the second node.

The electronic apparatus may further include a hole pattern control unit receiving the power voltage and provide a hole pattern signal to the hole pattern.

The hole pattern control unit may include a first hole pattern transistor including a first electrode connected to a first node receiving the power voltage, a second electrode connected to a second node outputting the hole pattern signal, and a first gate electrode connected to the first node, and a second hole pattern transistor including a third electrode connected to the second node, a fourth electrode connected to the first node, and a second gate electrode connected to the second node.

The hole lines may include scan hole lines connected to the scan lines, and data hole lines insulated and spaced apart from the scan hole lines and connected to the data lines, The scan hole lines and the data hole lines may be arranged in an alternating pattern.

The circuit element layer may include first to fourth insulation layers sequentially stacked on the base substrate. The transistor may include a semiconductor pattern disposed on the first insulation layer, a control electrode disposed on the second insulation layer and insulated from and at least partially overlapping the semiconductor pattern, an upper electrode disposed on the third insulation layer and insulated from and at least partially overlapping the control electrode, and an input electrode and an output electrode disposed on the fourth insulation layer and connected to opposing sides of the semiconductor pattern through contact holes defined in the first insulation layer to the fourth insulation layer.

The hole pattern may be disposed below the hole lines, and may be disposed on any one layer of the first insulation layer and the second insulation layer.

The hole pattern may include a central portion at least partially surrounding the second region and a protruding portion which protrudes in one direction from an edge of the hole pattern. Any one of the scan lines may include a first scan line spaced apart from the protruding portion and a second scan line spaced apart from the first scan line, at least partially overlapping the protruding portion and the central portion, and connected to a corresponding scan hole line among the scan hole lines, and the circuit element layer may further include a bridge pattern connecting the first scan line and the second scan line.

The electronic apparatus may further include an electronic module at least partially overlapping the second region and disposed below the display panel.

The electronic apparatus may further include an encapsulation substrate disposed on the display element layer, and a sealing member spaced apart from an edge of the display region and coupling the circuit element layer and the encapsulation substrate. A gap is formed between the encapsulation substrate and the display element layer.

The base substrate and the encapsulation substrate may be rigid, and pixels may be omitted from a region of the base substrate at least partially overlapping the second region.

The electronic apparatus may further include a first inorganic layer covering the display element layer, a second inorganic layer disposed on the first inorganic layer, and a thin film encapsulation layer including an organic layer disposed between the first inorganic layer and the second inorganic layer.

The base substrate may be flexible, and in the electronic apparatus, a module may penetrate the base substrate, the circuit element layer, the display element layer, and the thin film encapsulation layer. The module hole may at least partially overlap the second region.

The hole pattern may have a circular shape, an elliptical shape, or and polygonal shape.

The hole pattern may include division patterns spaced apart from each other.

An electronic apparatus includes a base substrate including a display region including a first region and a second region at least partially surrounded by the first region and having a higher light transmittance that the first region and a non-display region adjacent to the display region. A plurality of pixels is disposed on the base substrate. Each of the plurality of pixels receives a power voltage, and each is connected to a scan line transmitting a scan signal and a data line transmitting a data signal. A hole line connects the pixels to each other with the second region interposed between the pixels. A hole pattern is insulted from and at least partially overlaps the hole lines and surrounds the second region. The hole pattern is spaced apart from the second region and is closer to the base substrate than the hole lines are to the base substrate.

The electronic apparatus may further include a hole pattern control unit receiving the power voltage and provide a hole pattern signal to the hole pattern in response to the scan signal.

The hole pattern control unit may include a hole pattern transistor including a first electrode receiving the power voltage, a second electrode outputting the hole pattern signal, and a gate electrode receiving the scan signal.

The hole pattern control unit may include a first hole pattern transistor including a first electrode receiving the power voltage, a second electrode connected to a first node, and a gate electrode receiving the scan signal. At least one second hole pattern transistor may include a first electrode connected to the first node, a second electrode connected to a second node outputting the hole pattern signal, and a gate electrode connected to the first node. At least one third hole pattern transistor may include a first electrode connected to the second node, a second electrode connected to the first node, and a gate electrode connected to the second node.

The electronic apparatus may further include a hole pattern control unit receiving the power voltage and provide a hole pattern signal to the hole pattern.

The hole pattern control unit may include a first hole pattern transistor including a first electrode connected to a first node receiving the power voltage, a second electrode connected to a second node outputting the hole pattern signal, and a gate electrode connected to the first node, and a second hole pattern transistor including a first electrode connected to the second node, a second electrode connected to the first node, and a gate electrode connected to the second node.

BRIEF DESCRIPTION OF THE FIGURES

The accompanying drawings are included to provide a further understanding of the inventive concept, and are incorporated in and constitute a part of this specification. The drawings illustrate example embodiments of the inventive concept and, together with the description, serve to explain principles of the inventive concept. In the drawings:

FIG. 5B is an enlarged cross-sectional view of one portion of a display panel according to an embodiment of the inventive concept;

DETAILED DESCRIPTION OF THE DRAWINGS

Figure 1A:
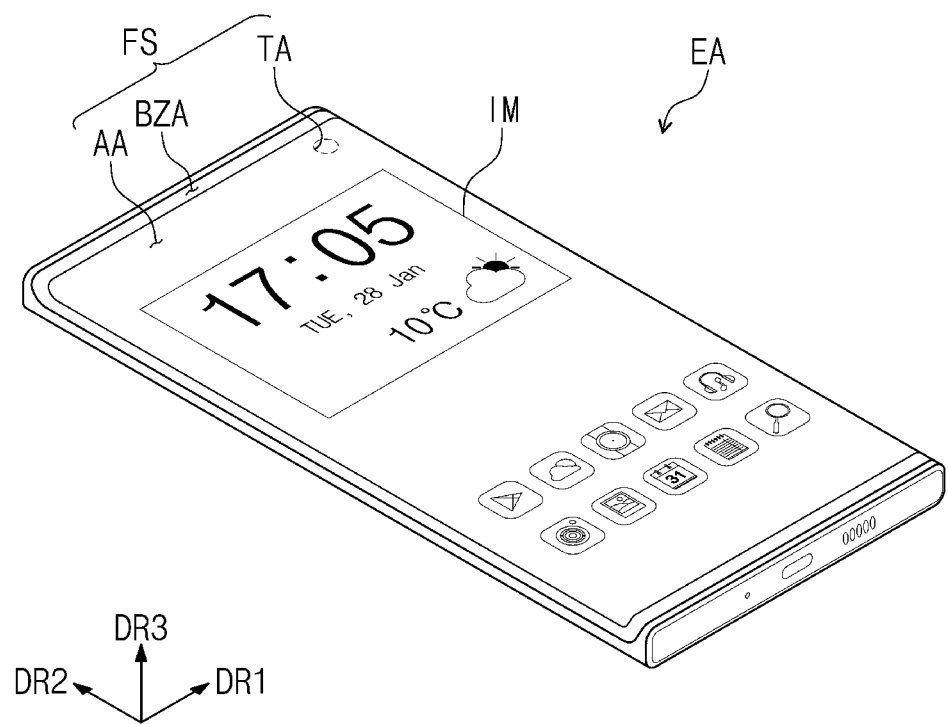
FIG. 1A is a perspective view of an electronic apparatus according to an embodiment of the inventive concept.

In the present disclosure, when an element (or an area, a layer, a portion, etc.) is referred to as being "on," "connected to," or "coupled to" another element, it may mean that the element is directly disposed on/connected to/coupled to the other element, or that a third element may be disposed therebetween.

Like reference numerals may refer to like elements throughout the specification and the drawings. Also, in the drawings, the thickness, the ratio, and the dimensions of elements may be exaggerated for an effective description of technical contents.

The term "and/or," includes all combinations of one or more of which associated configurations may define.

It will be understood that, although the terms "first". "second", etc. may be used herein to describe various elements, these elements should not necessarily be limited by these terms. These terms may be used to distinguish one element from another. For example, a first element could be termed a second element, and, similarly, a second element could be termed a first element, without departing from the scope of example embodiments of the inventive concept. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof. Hereinafter, example embodiments of the inventive concept will be described with reference to the accompanying drawings.

Figure 1B:
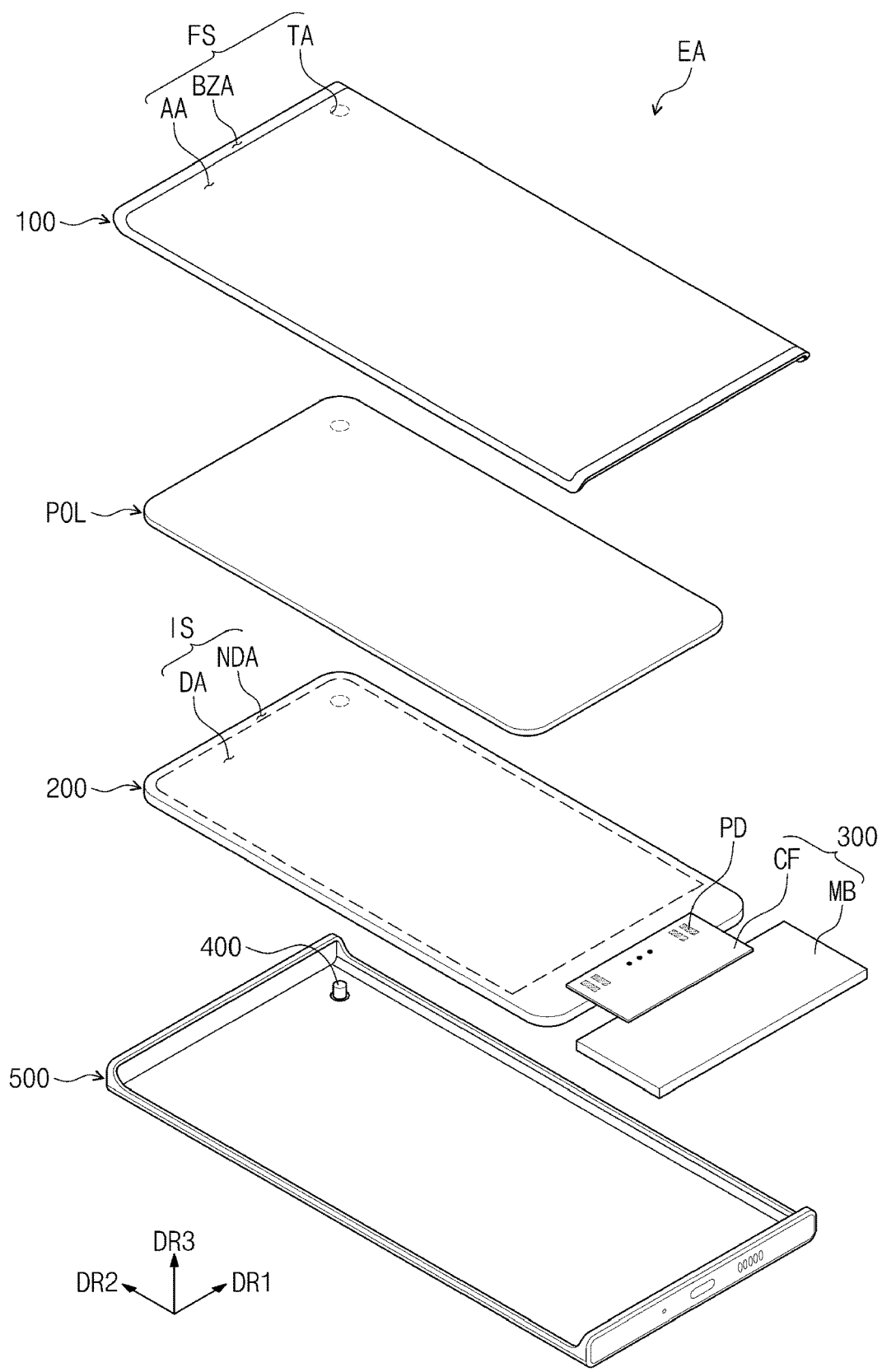
FIG. 1B is an exploded perspective view of an electronic apparatus according to an embodiment of the inventive concept.
Figure 2:
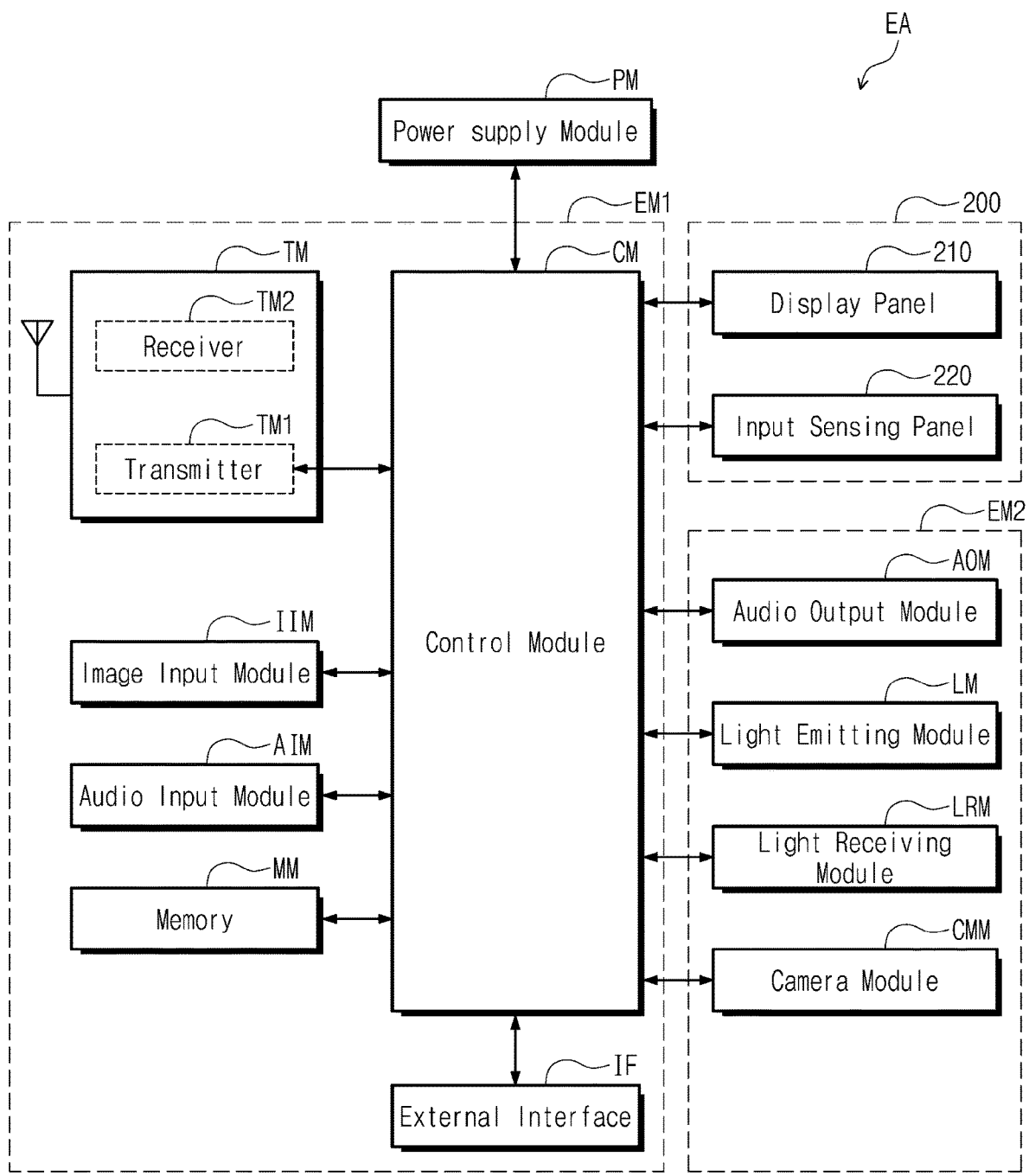
FIG. 2 is a block diagram of the electronic apparatus illustrated in FIG. 1A.

FIG. 1A is a perspective view of an electronic apparatus according to an embodiment of the inventive concept. FIG. 1B is an exploded perspective view of an electronic apparatus according to an embodiment of the inventive concept. FIG. 2 is a block diagram of the electronic apparatus illustrated in FIG. 1A.

An electronic apparatus EA may be a device activated by an electrical signal. The electronic apparatus EA may include various embodiments. For example, the electronic apparatus EA may include a tablet computer, a laptop computer, a computer monitor, a smart television, and the like. The electronic apparatus EA is exemplarily illustrated as being a smart phone.

As illustrated in FIG. 1A, the electronic apparatus EA may display an image IM on a front surface FS thereof. The front surface FS may be parallel to a plane defined by a first direction DR1 and a second direction DR2. The front surface FS includes an active region AA, a transmission region TA, and a bezel region BZA.

The electronic apparatus EA displays the image IM in the active region AA. The image IM may be a still image and/or a dynamic image. In FIG. 1A, as an example of the image IM, a clock and a plurality of icons are illustrated.

The active region AA extends in both the first direction DR1 and the second direction DR2, and may have a quadrilateral shape in which each corner is curved. However, this is only exemplarily illustrated. The active region AA may have various shapes, and the present invention is not necessarily limited to any one embodiment.

The bezel region BZA is adjacent to the active region AA. The bezel region BZA may at least partially surround the active region AA. For example, the bezel region BZA may be disposed adjacent only to one side of the active region AA, disposed adjacent to two sides of the active region AA, may be disposed adjacent to three sides of the active region AA, may be disposed around all four sides of the active region AA, or may be omitted all together. The electronic apparatus EA, according to an embodiment of the inventive concept, may include various embodiments, and the present invention is not necessarily limited to any one embodiment.

The transmission region TA may be disposed within the active region AA and may be at least partially surrounded by the active region AA. In addition, the transmission region TA may be surrounded by one side of the active region AA and one side of the bezel region BZA. The transmission region TA is illustrated as being disposed a right upper end of the front surface FS, but the invention is not necessarily limited to having the transmission region TA so-disposed. The transmission region TA may be variously changed according to the disposition relationship and shape of an electronic module 400 to be described later.

The normal direction of the front surface FS may correspond to a thickness direction DR3 (hereinafter, a third direction) of the electronic apparatus EA. A front surface (or an upper surface) and a back surface (or a lower surface) of each member are defined on the basis of a direction in which the image IM is displayed. The front surface and the back surface may oppose each other in the third direction DR3.

The electronic apparatus EA may sense a user input applied from the outside. The user input includes various forms of external inputs such as contact by a part of a users body, light, heat, or pressure. Also, the electronic apparatus EA may sense not only an input contacting the electronic apparatus EA but also an input in close proximity therewith or adjacent thereto and may also sense a degree of pressure being applied thereto.

Referring to FIG. 1B, the electronic apparatus EA may include a window 100, a display module 200, a circuit board 300, an electronic module 400, and an external case 500. The window 100 may be coupled to the external case 500 to define the exterior of the electronic apparatus EA. The electronic apparatus EA according to an embodiment may further include an optical member POL.

The window 100 may include a base window and a bezel pattern disposed on a lower portion of the base window and defining the bezel region BZA. The window 100 is disposed on the display module 200 and covers an entire surface IS of the display module 200.

The base window may include an optically transparent insulation material. For example, the base window may include glass or plastic. The base window may have a multi-layered structure or a single-layered structure. For example, the base window may have a laminate structure in which a plurality of plastic films are coupled to each other with an adhesive, or a laminate structure in which a glass substrate and a plastic film are coupled to each other with an adhesive. The active region AA and the bezel region BZA may be regions defined in the base window.

The window 100 includes the front surface FS that is externally exposed. The front surface FS of the electronic apparatus EA may be substantially defined by the front surface FS of the window 100.

For example, the active region AA and transmission region TA may be optically transparent regions. The boundary of the active region AA may have a shape corresponding to the boundary of a display region DA included in the display module 200.

The bezel pattern is disposed in the bezel region BZA. The bezel pattern may have a predetermined color. When the window 100 is provided as a glass or plastic substrate, the bezel pattern may be a printed colored layer or a color layer that has been deposited on one surface of the glass or plastic substrate. Alternatively, the bezel pattern may be formed by coloring a corresponding region of the glass or plastic substrate.

Accordingly, the bezel region BZA may be a region having a lower light transmittance than the active region AA. The bezel region BZA defines the shape of the active region AA. The bezel region BZA is adjacent to the active region AA, and may at least partially surround the active region AA.

The bezel region BZA may cover a non-display region NDA of the display module 200 to block the non-display region NDA from being viewed from the outside. Alternatively, the bezel region BZL may be omitted from the window 100.

The optical member POL is disposed between the window 100 and the display module 200. The optical member POL may include a polarizer and a phase retarder. The polarizer and the phase retarder may be of a stretched type or a coated type. The optical member POL lowers the reflectance of external light.

The display module 200 may display the image IM and sense an external input. The display module 200 includes the entire surface IS including the display region DA and the non-display region NDA. The display region DA may be a region activated according to an electrical signal.

The display region DA may be a region in which the image IM is displayed, and at the same time, may be a region in which an external input is sensed. The active region AA at least partially overlaps the display region DA of the window 100. For example, the active region AA at least partially overlaps a front surface of the display region DA. Accordingly, a user may view the image IM or provide an external input through the active region AA. However, this is only exemplarily illustrated. In the display region DA, a region in which the image IM is displayed and a region in which the external input is sensed may be separated from each other. However, the inventive concept is not necessarily limited to any one embodiment.

The non-display region NDA may be a region at least partially covered by the bezel region BZA of the window 100. The non-display region NDA is adjacent to the display region DA. The non-display region NDA may at least partially surround the display region DA. In the non-display region NDA, a driving circuit, a driving line, or another structure configured to drive the display region DA is disposed, and various signal lines, pads PD, an electronic element, or another structure providing an electrical signal to the display region DA may be disposed.

The display module 200 is assembled in a flat state in which the display region DA and the non-display region NDA face toward the window 100. However, this is only exemplarily illustrated. A portion of the non-display region NDA in the display module 200 may be bent. The bent region of the non-display region NDA faces toward a back surface of the display module 200, so that the bezel region BZA in the front surface of the electronic apparatus EA may be reduced.

Alternatively, the display module 200 may also be assembled in a state in which a portion of the display area DA is bent. Alternatively, in the display module 200, according to an embodiment of the inventive concept, the non-display area NDA may be omitted.

The circuit board 300 may be connected to the display module 200. The circuit board 300 may include a flexible circuit board CF and a main circuit board MB. The flexible circuit board CF may include an insulation film and conductive lines mounted on the insulation film. The conductive lines are connected to the pads PD to electrically connect the circuit board 300 and the display module 200 to each other.

The flexible circuit board CF may be assembled in a bent state. Accordingly, the main circuit board MB is disposed at the back surface of the display module 200 and is stably housed in a space provided by the external case 500. The flexible circuit board CF may be omitted, and the main circuit board MB may be directly connected to the display module 200.

The main circuit board MB may include signal lines and electronic elements now illustrated. The electronic elements may be connected to the signal lines to be electrically connected to the display module 200. The electronic elements generate various electrical signals, for example, a signal to generate the image IM or a signal to sense an external input, or process a sensed signal. The main circuit board MB may be provided in plural, but the present invention is not necessarily limited to any one embodiment.

In the electronic apparatus EA, according to an embodiment of the inventive concept, a driving circuit configured to provide an electrical signal to the display region DA may be directly mounted on the display module 200. The driving circuit may be mounted in a chip form, or may be formed together with pixels PX (see FIG. 3) to be described later. Accordingly, the area of the circuit board 300 may be reduced or omitted.

The electronic module 400 is disposed on a lower portion of the display module 200. For example, the position of the transmission region TA in the display region DA may be defined differently according to the position of the electronic module 400. The position of the transmission region TA may be defined according to the position of the electronic module 400. In a region at least partially overlapping the transmission region TA having a higher transmittance of light than the display region DA, components included in the display module 200 might not be disposed, or in a region at least partially overlapping the transmission region TA, the display module 200 may be penetrated to expose the electronic module 400, but the invention is not necessarily limited to any one embodiment.

The electronic module 400 may provide an output for an external input transmitted through the transmission region TA through the transmission region TA. Of the electronic module 400, at least one of a reception unit receiving an external input and an output unit configured to provide an output may overlap the transmission region TA on a plane. The electronic module 400 may at least partially overlap the active region AA, and thus, may prevent the increase of the bezel region BZA.

The external case 500 may be coupled to the window 100 to define the exterior of the electronic apparatus EA. In FIG. 1B, the external case 500 is shown as being composed of one contiguous member. However, the external case 500 may include two or more parts which are assembled to each other.

Referring to FIG. 2, the electronic apparatus EA may include the display module 200, a power supply module PM, a first electronic module EM1, and a second electronic module EM2. The display module 200, the power supply module PM, the first electronic module EM1, and the second electronic module EM2 may be electrically connected to each other. In FIG. 2, a display panel 210 and a input sensing panel 220 among the components of the display module 200 are exemplarily illustrated.

The input sensing panel 220 may sense the above-described external input. The input sensing panel 220 may include a plurality of conductive layers and an insulation layer disposed between the conductive layers. The input sensing panel 220 may be provided as a separate unit on the display panel 210 and may be coupled to the display panel 210 by an adhesive, or may be directly formed on the display panel 210 through a series of processes with the display panel 210. However, the inventive concept is not necessarily limited thereto.

The first electronic module EM1 and the second electronic module EM2 include various functional modules for operating the electronic apparatus EA. The first electronic module EM1 may be directly mounted on a mother board electrically connected to the display module 200, or may be mounted on a separate substrate and electrically connected to the mother board through a connector or the like.

The first electronic module EM1 may include a control module CM, a wireless communication module TM, an image input module IIM, an audio input module AIM, a memory MM, and an external interface IF. Some of the modules might not be mounted on the mother board, but instead, may be electrically connected to the mother board through a flexible printed circuit board.

The control module CM controls the overall operation of the electronic apparatus EA. The control module CM may be a microprocessor. For example, the control module CM either activates or deactivates the display module 200. The control module CM may control other modules, such as the image input module IIM or the audio input module AIM on the basis of a touch signal received from the display module 200.

The wireless communication module TM may transmit/receive wireless signals with other terminals using Bluetooth or a Wi-Fi line. The wireless communication module TM may transmit/receive voice signals using a general communication line. The wireless communication module TM includes a transmitter unit TM1 for modulating and transmitting a signal, and a receiver unit TM2 for demodulating a received signal.

The image input module IIM processes an image signal and converts the processed image signal into image data displayable on the display module 200. The audio input module AIM receives an external sound signal through a microphone in a recording mode, a voice recognition mode, and the like, and converts the received external sound signal into electrical voice data.

The external interface IF serves as an interface to be connected to an external charger, a wired/wireless data port, a card socket (for example, a memory card, a SIM/UIM card), and the like.

The second electronic module EM2 may include an audio output module AOM, a light emitting module LM, a light receiving module LRM, a camera module CMM, and the like. The above components may be directly mounted on a mother board or on a separate substrate and electrically connected to the display module 200 or electrically connected to the first electronic module EM1 through a connector and the like.

The audio output module AOM converts sound data received from the wireless communication module TM or sound data stored in the memory MM and outputs the converted sound data to the outside.

The light emitting module LM generates and outputs light. The light emitting module LM may output an infrared ray. For example, the light emitting module LM may include an LED element. For example, the light receiving module LRM may sense an infrared ray. The light receiving module LRM may be activated when an infrared ray of a predetermined level or higher is sensed. The light receiving module LRM may include a CMOS sensor. After generated infrared light is output from the light emitting module LM, the infrared light is reflected by an external object (such as a user's finger or face) and the reflected infrared light may be incident on the light receiving module LRM. The camera module CMM captures an external image.

The electronic module 400, according to an embodiment of the inventive concept, may include at least one of components of the first electronic module EM1 and the second electronic module EM2. For example, the electronic module 400 may include at least one of a camera, a speaker, a light sensing sensor, or a heat sensing sensor. The electronic module 400 may sense an external object received through the transmission region TA, or may provide a sound signal such as a voice sound through the transmission region TA. In addition, the electronic module 400 may include a plurality of components, but the present invention is not necessarily limited to any one embodiment.

Figure 3:
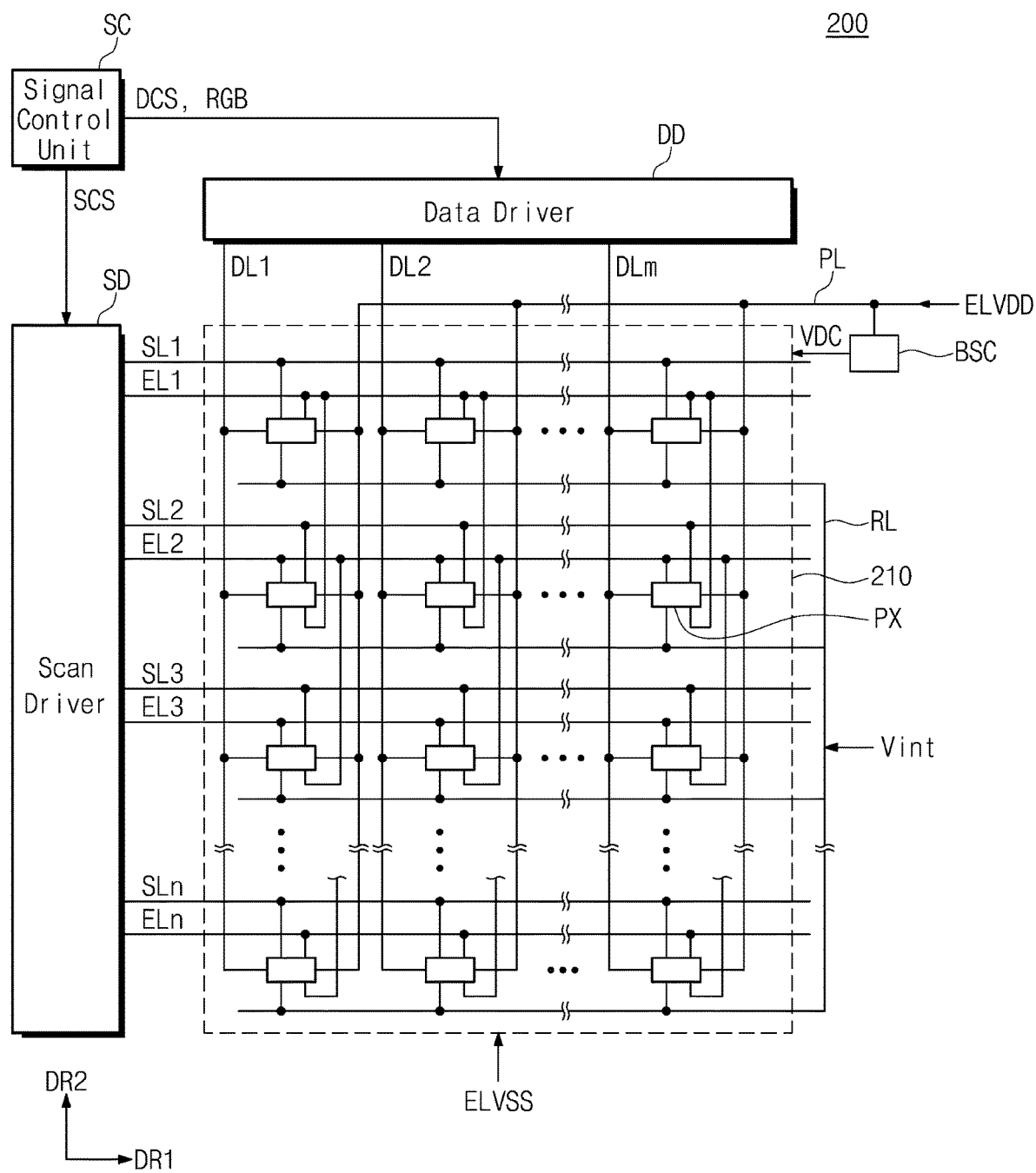
FIG. 3 is a block diagram of a display panel according to an embodiment of the inventive concept.
Figure 4A:
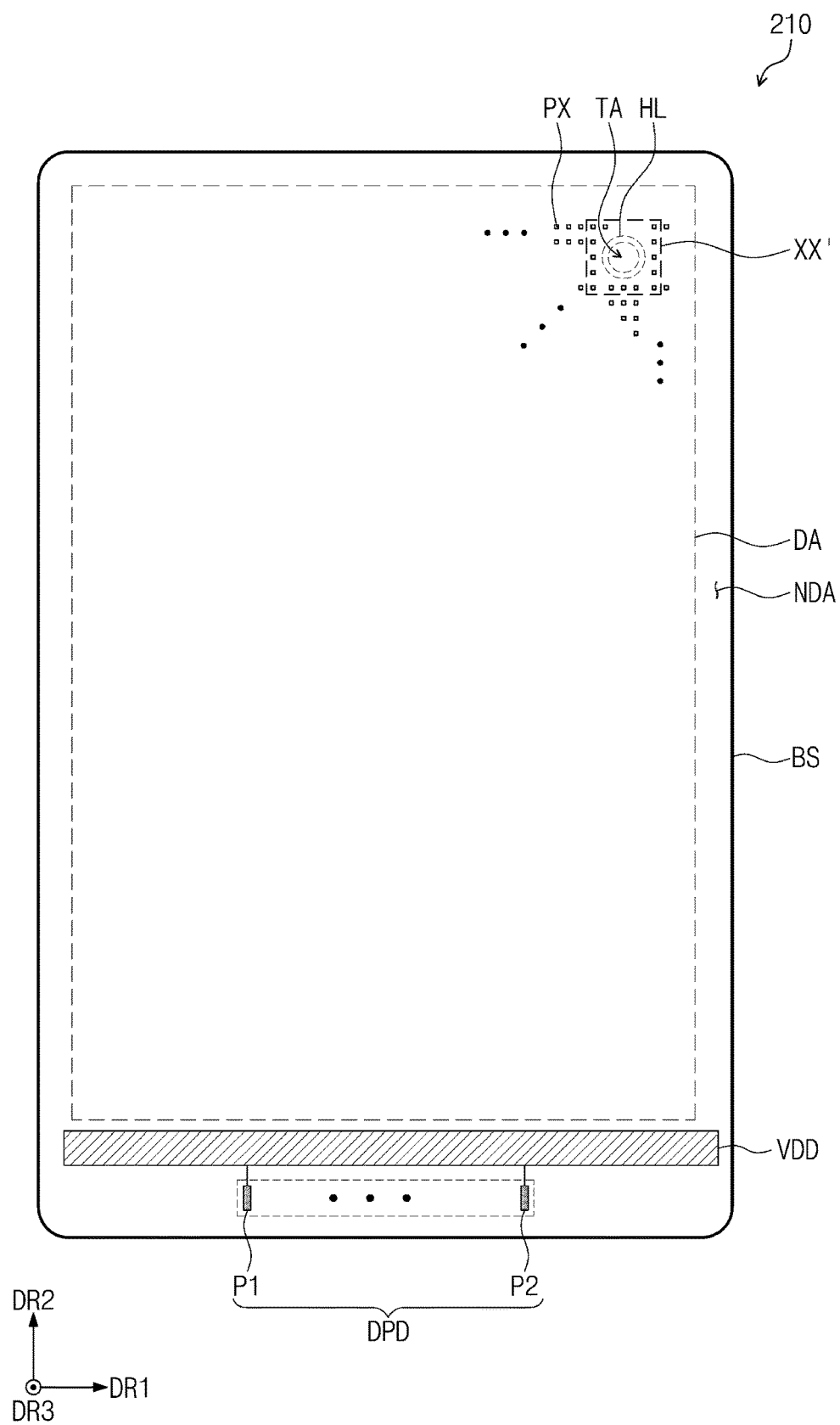
FIG. 4A is a plan view of a display panel according to an embodiment of the inventive concept.
Figure 4B:
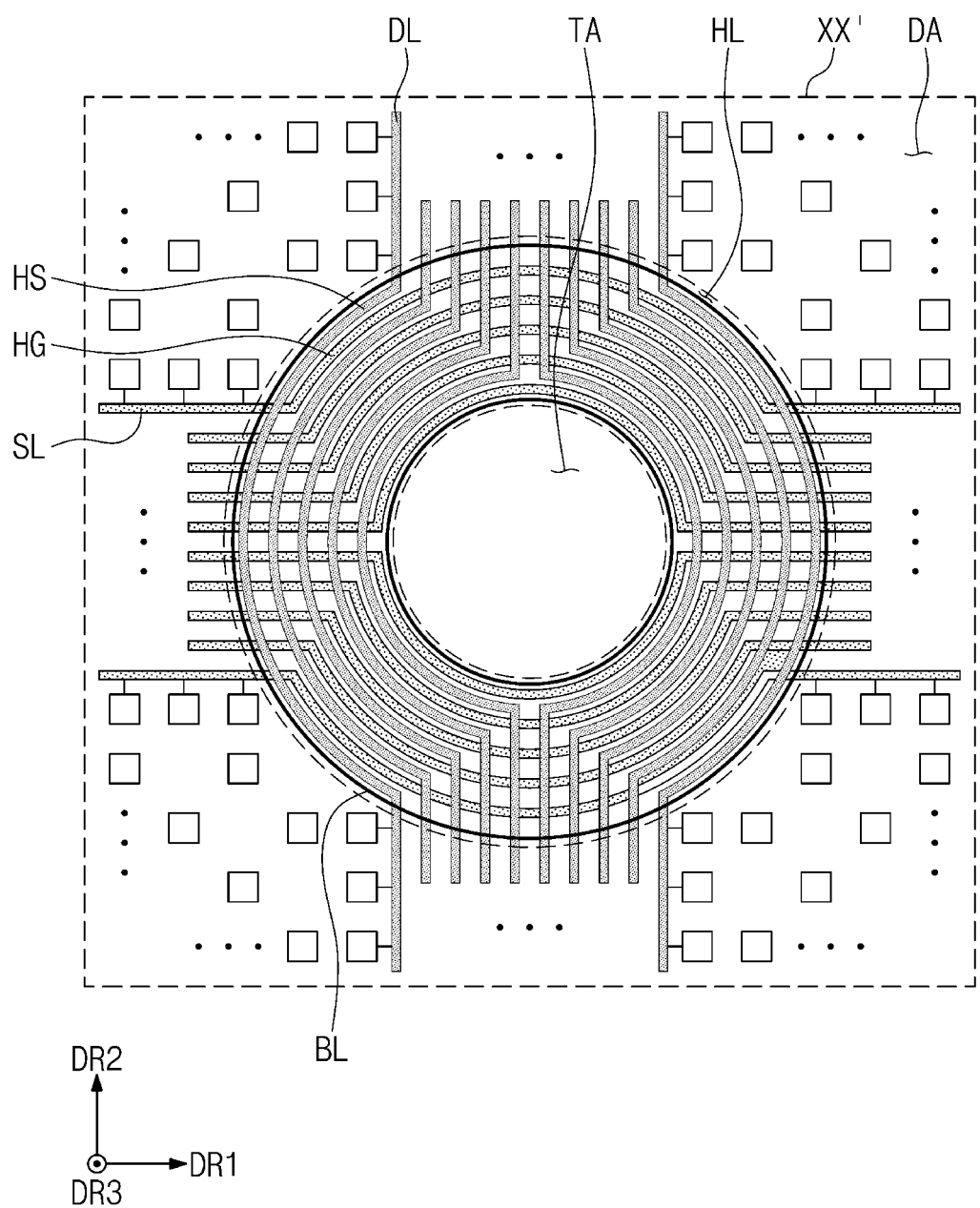
FIG. 4B is an enlarged view of region XX' illustrated in FIG. 4A.

FIG. 3 is a block diagram of a display panel according to an embodiment of the inventive concept. FIG. 4A is a plan view of a display panel according to an embodiment of the inventive concept. FIG. 4B is an enlarged view of region XX' illustrated in FIG. 4A.

Referring to FIG. 3, the display module 200 includes a signal controller SC, a scan driver SD, a data driver DD, and the display panel 210. The display panel 210 displays an image according to an electrical signal.

The signal controller SC receives input image signals, and converts the data format of the input image signals to match interface specifications of the scan driver SD to generate image data RGB. The signal controller SC outputs the image data RGB and various control signals DCS and SCS.

The scan driver SD receives a scan control signal SCS from the signal controller SC. The scan control signal SCS may include a vertical start signal which starts the operation of the scan driver SD, a clock signal which determines the output timing of signals, and the like.

The scan driver SD generates a plurality of scan signals and sequentially outputs the scan signals to a plurality of scan lines SL1 to SLn. Also, the scan driver SD generates a plurality of light emission control signals in response to the scan control signal SCS, and outputs the light emission control signals to a plurality of light emission lines EL1 to ELn.

In FIG. 3, scan signals and light emission control signals are illustrated as being output from one scan driver SD, but the inventive concept is not necessarily limited thereto. According to an embodiment, scan driving circuits may divide and then output the scan signals, and may divide and then output the emission control signals. In addition, in an embodiment, a driving circuit configured to generate and then output the scan signals and a driving circuit configured to generate and then output the light emission control signals may be different from each other.

The data driver DD receives a data control signal DCS and the image data RGB from the signal controller SC. The data driving circuit DD converts the image data RGB into data signals and outputs the data signals to data lines DL1 to DLm. The data signals may be analog voltages corresponding to gray scale values of the image data RGB.

The display panel 210 includes the scan lines SL1 to SLn, the light emission lines EL1 to ELn, the data lines DL1 to DLm, and pixels PX. The scan lines SL1 to SLn extend in a first direction DR1 and arranged in a second direction DR2 orthogonal to the first direction DR1.

Each of the plurality of light emission lines EL1 to ELn may be arranged in parallel to a corresponding scan line among the scan lines SL1 to SLn. The data lines DL1 to DLm intersect the scan lines SL1 to SLn while being insulated therefrom.

Each of the plurality of pixels PX is connected to a corresponding scan line among the scan lines SL1 to SLn, a corresponding light emission line among the light emission lines EL1 to ELn, and a corresponding data line among the data lines DL1 to DLm.

Each of the pixels PX receives a first voltage ELVDD corresponding to a power voltage and a second voltage ELVSS lower than the first voltage ELVDD. Each of the pixels PX is connected to a power line PL to which the first voltage ELVDD is applied. Each of the pixels PX is connected to an initialization line RL which receives an initialization voltage Vint.

Each of the plurality of pixels PX may be electrically connected to three scan lines. For example, as illustrated in FIG. 3, pixels on a second pixel row may be connected to first to third scan lines SL1 to SL3.

The display panel 210 may further include a plurality of dummy scan lines. The display panel 210 may further include a dummy scan line connected to pixels PX of a first pixel row and a dummy scan line connected to pixels PX of an n-th pixel row. In addition, pixels (hereinafter, pixels of a pixel row) connected to any one data line among the data lines DL1 to DLm may be connected to each other. Two adjacent pixels among the pixels of the pixel row may be electrically connected to each other.

Each of the plurality of pixels PX includes a light emitting element and a pixel driving circuit which controls the light emission of the light emitting element. The pixel driving circuit unit may include a plurality of thin-film transistors and a capacitor. At least one of the pixel driving circuit and the data driver DD may include transistors formed through the same process as a process for forming the pixel driving circuit.

Through performing a photolithography process for a plurality of times, the scan lines SL1 to SLn, the light emission lines EL1 to ELn, the data lines DL1 to DLm, the power line PL, the initialization line RL, the pixels PX, the scan driver SD, and the data driver DD may be formed on a base substrate. Through performing a deposition process or a coating process for a plurality of number of times, insulation layers may be formed on the base substrate. Each of the insulation layers may be a thin film which covers the entire display panel 210, or may include at least one insulation pattern which overlaps only a specific component of the display panel 210. The insulation layers include an organic layer and/or an inorganic layer. In addition, an encapsulation layer configured to protect the pixels PX may further be formed on the base substrate.

The display module 200 may further include a hole pattern control unit BSC which receives the first voltage ELVDD of the power voltage and provides a hole pattern signal VDC to a hole pattern BL as is described below. The hole pattern control unit BSC and the hole pattern BL will be described later.

Referring to FIG. 4A, the display panel 210 may include a base substrate BS, a plurality of pixels PX, a plurality of signal lines, and a plurality of display pads DPD.

The base substrate BS may include a display region DA and a non-display region NDA. The display region DA may include a hole line region HL (e.g., a "first region") which at least partially surrounds the transmission region TA (e.g., a "second region"). The hole line region HL may be a region in which hole lines and hole patterns are disposed. The hole lines may be spaced apart from each other with the transmission region TA interposed therebetween, and may connect pixels which receive the same signal. The hole line region FIL may be defined as having a shape at least partially surrounding the transmission region TA depending on a position at which the transmission region TA is defined, that is, the position of the electronic module 400.

The base substrate BS may include an insulation substrate. For example, the base substrate BS may be composed of a rigid glass substrate, a plastic substrate, or a combination thereof, or may include flexible polyimide.

The pixels PX are disposed around the hole line region HL, and may at least partially surround the hole line region H L on a plane. FIG. 4A illustrates the hole line region H L with dotted lines to facilitate the description.

A power supply pattern VDD is disposed in the non-display region NDA. The power supply pattern VDD is connected to a plurality of power lines PL. Accordingly, the display panel 210 may provide the same first power signal to the plurality of pixels PX by including the power supply pattern VDD.

The display pads DPD may include a first pad P1 and a second pad P2. The first pad P1 may be provided in plural to be respectively connected to the data lines DL. The second pad P2 is connected to the power supply pattern VDD to be electrically connected to the power supply line PL. The display panel 210 may provide electrical signals provided from the outside through the display pads DPD to the pixels PX. The display pads DPD may further include pads for receiving other electrical signals in addition to the first pad P1 and the second pad P2, but are not necessarily limited to any one embodiment.

FIG. 4B is an enlarged view of region XX' illustrated in FIG. 4A, and for convenience of description, components disposed inside the display panel 210 are illustrated with solid lines.

The hole line region HL may at least partially surround the transmission region TA. In the hole line region HL, hole lines HG and HS and the hole pattern BL may be disposed at least partially overlapping each other.

The hole lines HG and HS may be disposed between lines passing through the transmissive region TA among the scan lines SL1 to SLn and the data lines DL1 to DLm illustrated in FIG. 3. The hole lines HG and HS may include scan hole lines HG and data hole lines HS.

The scan hole lines HG may be disposed between the scan lines SL1 to SLn spaced apart by the transmission regions TA among the scan lines SL1 to SLn extended in the first direction DR1. A scan line SL illustrated in FIG. 4B may be any one among the scan lines SL1 to SLn illustrated in FIG. 3.

Some of pixels connected to the scan line SL are disposed on the left side of the transmission region TA, and the others thereof are disposed on the right side of the transmission region TA. Since the scan hole lines HG overlap the hole line region HL and are disposed between the scan lines SL, pixels in the same row may be turned on/off by substantially the same scan signal even when some pixels are omitted around the transmission region TA.

The data hole lines HS may be disposed between the data lines DL1 to DLm spaced apart by the transmission regions TA among the data lines DL1 to DLm extended in the second direction DR2. A data line DL illustrated in FIG. 4B may be any one among the data lines DL1 to DLm illustrated in FIG. 3.

Some of pixels connected to the data line DL are disposed on the upper side of the transmission region TA, and the others thereof are disposed on the lower side of the transmission region TA. Since the data hole lines HS overlap the hole line region HL and are disposed between the data line DL, pixels in the same column may receive a data signal through substantially the same line even when some pixels are omitted around the transmission region TA.

The hole pattern BL may at least partially overlap a front surface of the transmission region TA and of the hole line region HL.

Figure 5A:
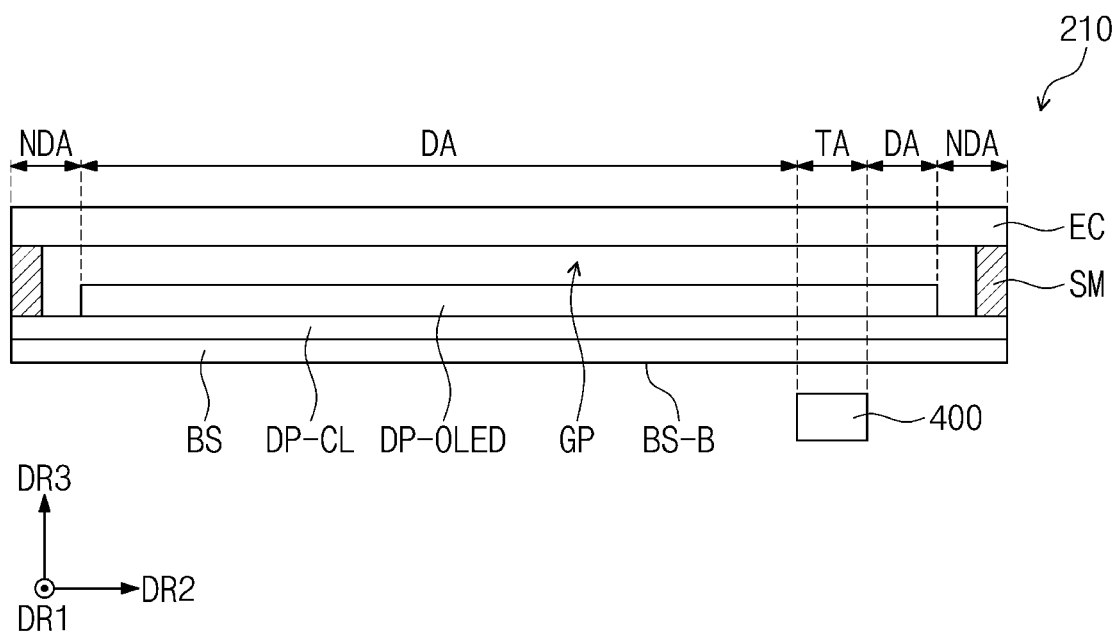
FIG. 5A is a cross-sectional view of a display panel according to an embodiment of the inventive concept.
Figure 5C:
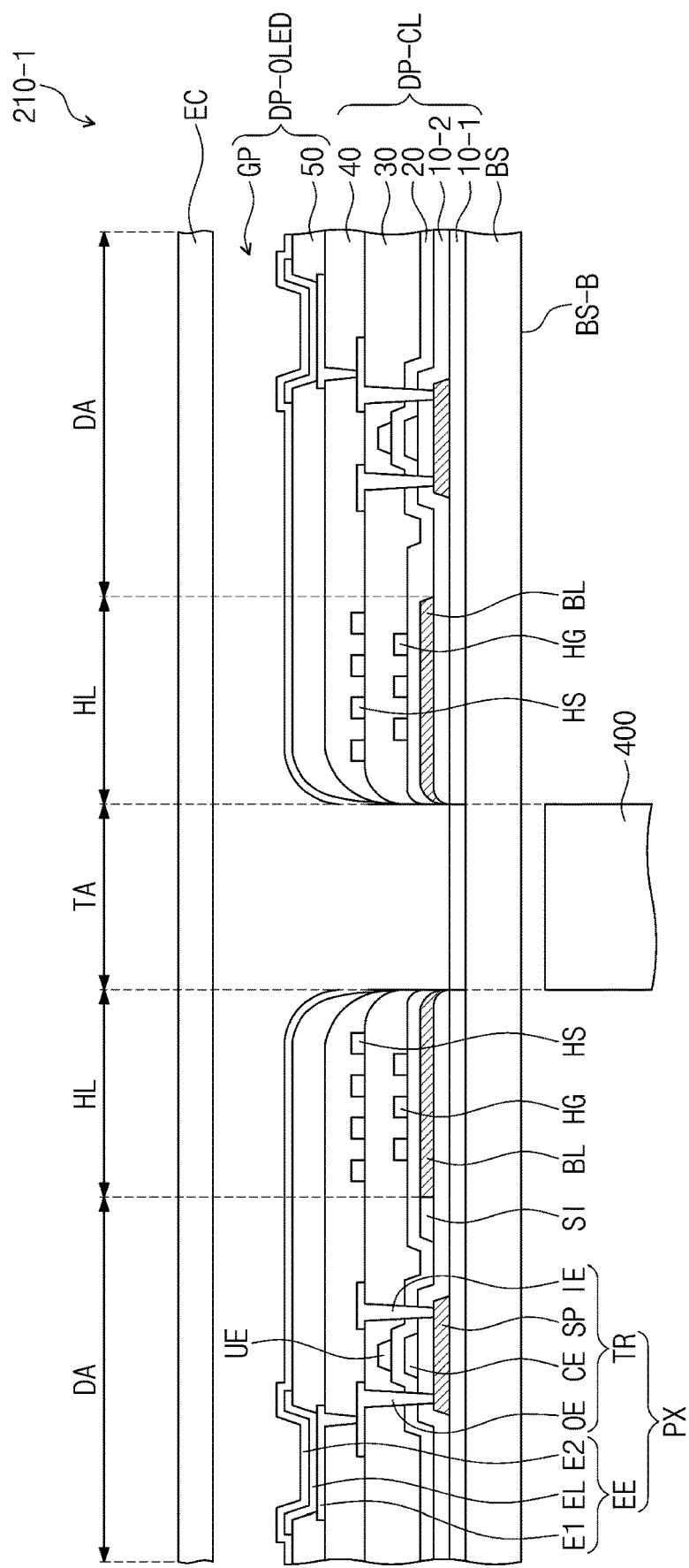
FIG. 5C is an enlarged cross-sectional view of one portion of a display panel according to an embodiment of the inventive concept.
Figure 6A:
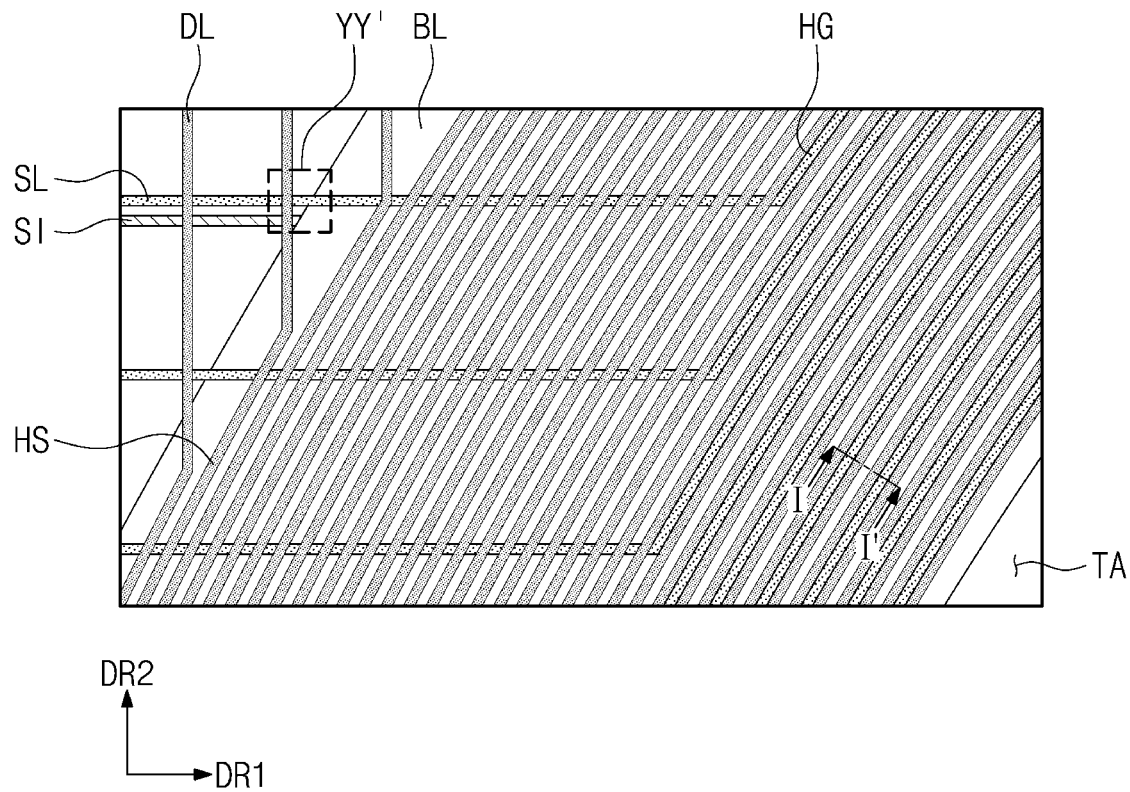
FIG. 6A is an enlarged view of a region adjacent to a hole line region according to an embodiment of the inventive concept.
Figure 6B:
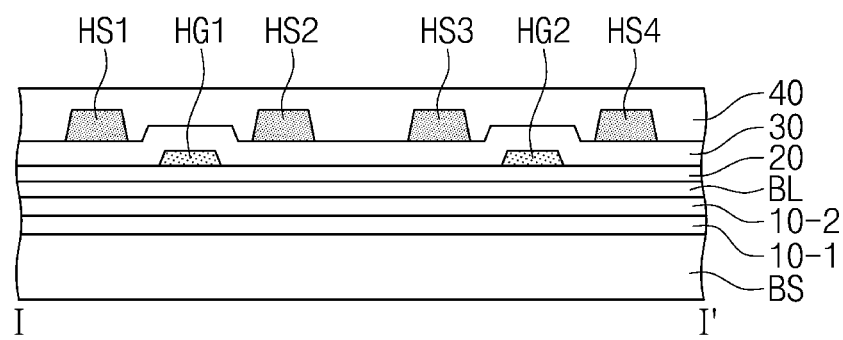
FIG. 6B is a cross-sectional view taken along line I-I' of FIG. 6A.

FIG. 5A is a cross-sectional view of a display panel according to an embodiment of the inventive concept. FIG. 5B is an enlarged cross-sectional view of one portion of a display panel according to an embodiment of the inventive concept. FIG. 5C is an enlarged cross-sectional view of one portion of a display panel according to an embodiment of the inventive concept. FIG. 6A is an enlarged view of a region adjacent to a hole line region according to an embodiment of the inventive concept. FIG. 6B is a cross-sectional view taken along line I-I' of FIG. 6A.

Referring to FIG. 5A, the display panel 210 may include the base substrate BS, a circuit element layer DP-CL disposed on the base substrate BS, a display element layer DP-OLED disposed on the circuit element layer DP-CL, an encapsulation substrate EC, and a sealing member SM.

The base substrate BS may include a glass substrate. In addition, the base substrate BS may include a substrate having a substantially constant refractive index in the visible light wavelength range.

The circuit element layer DP-CL includes at least one insulation layer and a circuit element. The circuit element layer DP-CL may include a thin film transistor. Hereinafter, an insulation layer of the circuit element layer DP-CL includes at least one inorganic film and/or at least one organic film. A circuit element includes a signal line, a driving circuit of a pixel, and the like.

The display element layer DP-OLED includes at least a light emitting element. The display element layer DP-OLED may include organic light emitting diodes as the light emitting element. The display element layer DP-OLED includes a pixel definition film, for example, including an organic material.

The encapsulation substrate EC may be a transparent substrate. The encapsulation substrate EC may include a glass substrate. In addition, the encapsulation substrate EC may include a substrate having a substantially constant refractive index in the visible light wavelength range.

The laminate structure of the base substrate BS to the display element layer DP-OLED may be defined as a lower display substrate. The sealing member SM may couple the lower display substrate and the encapsulation substrate EC to each other. The sealing member SM may extend along an edge of the encapsulation substrate EC.

The sealing member SM at least partially overlaps the non-display region NDA of the display panel 210. The non-display region NDA of the display panel 210 is a region in which the pixels PX are omitted from (e.g., not formed). Therefore, the sealing member SM may be spaced apart from an edge of the display region DA.

The sealing member SM may form a gap GP between the lower display substrate and the encapsulation substrate EC. The gap GP may be filled with air or inert gases (hereinafter, an external gas). The encapsulation substrate EC and the sealing member SM may prevent moisture from penetrating into the lower display substrate. In an embodiment of the inventive concept, the sealing member SM may directly couple an upper surface of the base substrate BS or an upper surface of the circuit element layer DP-CL to a lower surface of the encapsulation substrate EC.

The sealing member SM may include an inorganic adhesive layer such as a flit. However, the inventive concept is not necessarily limited thereto. The sealing member SM may include an organic adhesive layer. Since the display panel 210 may be completely sealed from the outside, the strength thereof is increased and the defect of a light emitting element may be prevented.

The electronic module 400 may be disposed in a lower portion BS-B of the base substrate BS. Since the electronic module 400 is disposed in a region at least partially overlapping the display region DA in the base substrate BS, in the case of the electronic module 400 (e.g., a camera module (CMM) and the like) which requires external light, diffraction and interference of the external light may occur due to components of the circuit element layer DP-CL adjacent to the transmission area TA, which may be a defect in the camera module CMM.

Referring to FIG. 5B, the circuit element layer DP-CL may include a plurality of insulation layers. The circuit element layer DP-CL may include a first insulation layer 10, a second insulation layer 20, a third insulation layer 30, and a fourth insulation layer 40. In FIG. 5B, the disposition relationship of a semiconductor pattern SP, a control electrode CE, an input electrode IE, and an output electrode OE constituting a driving transistor TR is exemplarily illustrated.

The first insulation layer 10 is disposed on the base substrate BS to cover the front surface of the base substrate BS. The first insulation layer 10 may include a barrier layer and/or a buffer layer. Accordingly, the first insulation layer 10 may prevent oxygen or moisture introduced through the base substrate BS from penetrating into a pixel, or may reduce the surface energy of the base substrate BS such that the pixel is stably formed on the base substrate BS.

However, this is only exemplarily illustrated. In the display panel 210, according to an embodiment of the inventive concept, at least one of the barrier layer and the buffer layer may be omitted, or the display panel 210 may have a structure in which a plurality of layers are stacked, but the present invention is not necessarily limited to any one embodiment.

The thin film transistor TR is disposed on the first insulation layer 10. The thin film transistor TR includes the semiconductor pattern SP, the control electrode CE, the input electrode IE, and the output electrode OE. The semiconductor pattern SP is disposed on the first insulation layer 10. The semiconductor pattern SP may include a semiconductor material. The control electrode CE is insulated from and at least partially overlaps the semiconductor pattern SP with the second insulation layer 20 interposed therebetween.

The input electrode IE and the output electrode OE are disposed on the third insulation layer 30 and are spaced apart from each other on a plane. The input electrode IE and the output electrode OE penetrate the second insulation layer 20 and the third insulation layer 30, and are connected to opposing sides of the semiconductor pattern SP, respectively.

The fourth insulation layer 40 is disposed on the third insulation layer 30 to cover the input electrode IE and the output electrode OE. In the thin film transistor TR, the semiconductor pattern SP may be disposed on the control electrode CE. Alternatively, the semiconductor patter SP may be disposed on the input electrode E1 and the output electrode OE. Alternatively, the input electrode IE and the output electrode OE may be disposed on the same layer as the semiconductor pattern SP and directly connected to the semiconductor pattern SP. The thin film transistor TR according to an embodiment of the inventive concept may be formed in various structures, and the present invention is not necessarily limited to any one embodiment.

A light emitting element EE is disposed on the fourth insulation layer 40. The light emitting element EE includes a first electrode E1, an organic layer EL, and a second electrode E2.

The first electrode E1 may penetrate the fourth insulation layer 40 and may be connected to the thin film transistor TR. The display module 200 may further include a separate connection electrode disposed between the first electrode E1 and the thin film transistor TR, and the first electrode E1 may be electrically connected to the thin film transistor TR through the connection electrode.

A fifth insulation layer 50 is disposed on the fourth insulation layer 40. The fifth insulation layer 50 may include an organic material and/or an inorganic material, and may have a single-layered structure or a multi-layered structure. In the fifth insulation layer 50, an opening may be defined. The opening exposes at least a portion of the first electrode E1. The fifth insulation layer 50 may be a pixel definition film.

The organic layer EL is disposed between the first electrode E1 and the second electrode E2. The organic layer EL may include at least one light emitting layer. For example, the organic layer EL may be composed of at least one material of materials emitting red, green, or blue colors, and may include a fluorescent material or a phosphorescent material. The organic layer EL may include an organic light emitting material or an inorganic light emitting material. The organic layer EL may emit light in response to a potential difference between the first electrode E1 and the second electrode E2.

The organic layer EL is illustrated as being provided as a plurality of patterns corresponding to each opening. However, this is only exemplarily illustrated. The organic layer EL may be provided as a layer having an integral shape at least partially overlapping a plurality of openings, but the present invention is not necessarily limited to any one embodiment.

The organic layer EL may further include a charge control layer in addition to the light emitting layer. The charge control layer is configured to control the movement of charges, and thus, increases light emission efficiency and lifespan of the light emitting element EE. The organic layer EL may include at least any one of a hole transport material, a hole injection material, an electron transport material, or an electron injection material.

The second electrode E2 is disposed on the organic layer EL. The second electrode E2 may be opposite to the first electrode E1. The second electrode E2 may have an integral shape extending from the display region DA to the hole line region HL. The second electrode E2 may be commonly provided to the plurality of pixels. Each light emitting element EE disposed in each pixel receives a common power voltage through the second electrode E2.

The second electrode E2 may include a transmissive conductive material or a transreflective conductive material. Accordingly, light generated in the organic layer EL may be emitted toward the third direction DR3 through the second electrode E2. However, this is only exemplarily illustrated. The light emitting element EE according to an embodiment of the inventive concept may be driven, according to the design thereof, by a back surface light emitting method in which the first electrode E1 includes a transmissive or a transreflective material, or by a double-sided light emitting method in which light is emitted toward both front and back surfaces, but the present invention is not necessarily limited to any one embodiment.

In the inventive concept, the transistor TR and the light emitting element EE may be defined as one pixel PX.

The base substrate BS may be rigid. In a region of the base substrate BS overlapping the transmission region TA, the pixels PX might not be disposed. Therefore, as electronic module 400 is disposed in the lower portion of the base substrate BS while at least partially overlapping the transmission region TA, external light may be provided thereto.

The hole pattern BL and the hole lines HG and HS are disposed at least partially overlapping the hole line region HL. The hole pattern BL may be disposed on the first insulation layer 10. The hole pattern BL may be formed on the same layer as the semiconductor pattern SP. Therefore, the hole pattern BL may be formed by the same process as the semiconductor pattern SP.

The hole pattern BL is spaced apart from the transmission region TA, and may be disposed closer to the base substrate BS than the hole lines HS and HG are to the base substrate BS. The hole pattern BL may be wider than the total region in which the hole lines HS and HG are disposed in the hole line region HL. The hole pattern BL may at least partially surround the transmission region TA.

A hole control line SI connected to the hole pattern BL may be included. The hole control line SI may provide the hole pattern signal VDC provided by the hole pattern control unit BSC illustrated with reference to FIG. 3 to the hole pattern BL. Therefore, the hole pattern BL may receive a voltage provided from the hole pattern control unit BSC, and may form a predetermined capacitance with the hole lines HG and HS disposed on the hole pattern BL while being insulated from each other and receiving different signals. The hole control line SI may be formed on the same layer as the hole pattern BL.

Since the hole pattern BL is disposed closer to the base substrate BS than the hole lines HG and HS are to the base substrate, a situation in which external light is reflected from the electronic module 400 and then is re-incident on the electronic module 400 through diffraction and/or interference may be prevented. Therefore, the electronic apparatus EA with increased reliability may be provided.

Referring to FIG. 5C, a display panel 210-1 may further include an upper electrode UE insulated from and at least partially overlapping the control electrode CE.

The semiconductor pattern SP is disposed on a first insulation layer 10-1. The control electrode CE may be disposed on an additional insulation layer 10-2 (e.g., a "second insulation layer") which covers the first insulation layer 10-1. The upper electrode UE may be disposed on the second insulation layer 20 (e.g., "a third insulation layer") which covers the additional insulation layer 10-2. The input electrode IE and the output electrode OE may be disposed on the third insulation layer 30 (e.g., a "fourth insulation layer") which covers the second insulation layer 20. The input electrode IE and the output electrode OE may be connected to opposing sides of the semiconductor pattern SP through contact holes defined in the first to third insulation layers 10-1, 20, and 30.

The upper electrode UE may overlap the control electrode CE on a plane. The upper electrode UE may receive the same electrical signal as the control electrode CE, or may receive a different electrical signal from the control electrode CE to function as one electrode of a capacitor.

The hole pattern BL may be disposed on the additional insulation layer 10-2. Therefore, the hole pattern BL may be formed by the same process as the control electrode CE. The scan hole line HG of the hole lines HG and HS is formed on the second insulation layer 20. The scan hole line HG may be formed by the same process as the upper electrode UE. The data hole line HS of the hole lines HG and HS is formed on the third insulation layer 30. The data hole line HS may be formed by the same process as the input electrode IE and the output electrode OE.

Referring to FIG. 6A and FIG. 6B, the scan hole lines HG and the data hole lines HS may be alternately disposed in the hole line region HL. Therefore, the hole pattern signal VDC provided by the hole pattern control unit BSC is applied to the hole pattern BL while having a predetermined voltage, and may form a predetermined capacitance between the hole lines HG and HS receiving different signals.

FIG. 6B may include the same structure as the cross-sectional structure of FIG. 5C. The hole pattern BL is disposed on the additional insulation layer 10-2. Scan hole lines HG1 and HG2 are disposed on the second insulation layer 20, and may be insulated from and alternately disposed with data hole lines HS1, HS2, HS3, and HS4 disposed on the third insulation layer 30.

Figure 7A:
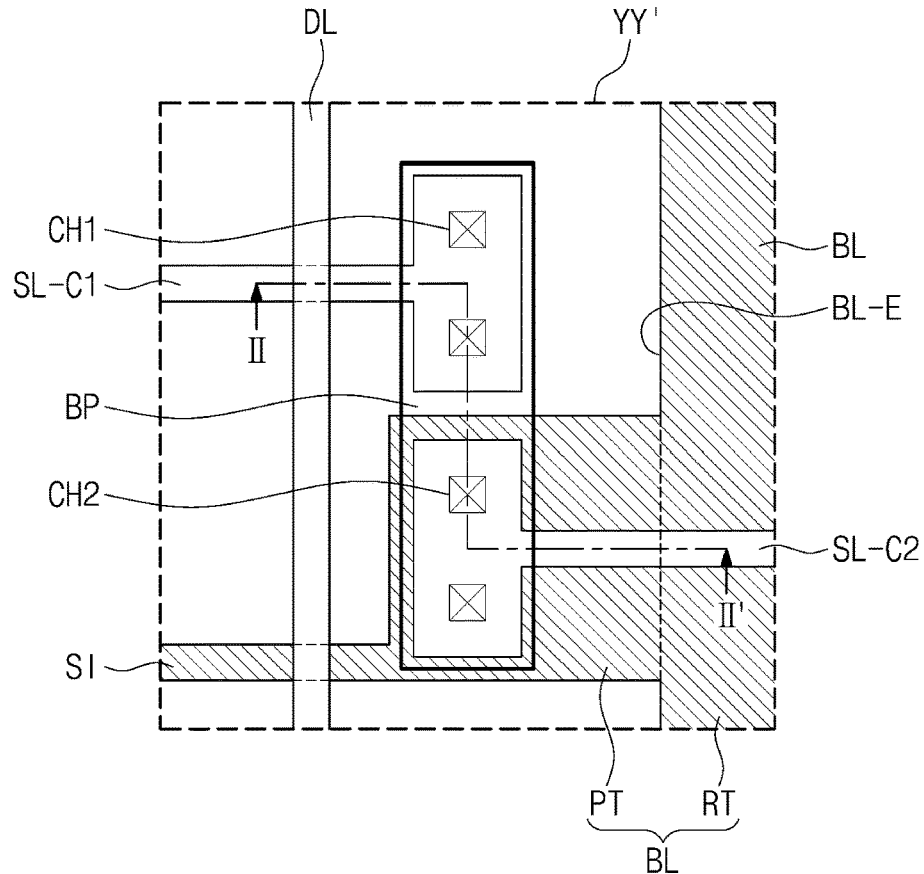
FIG. 7A is an enlarged view of region YY' illustrated in FIG. 6A.
Figure 7B:
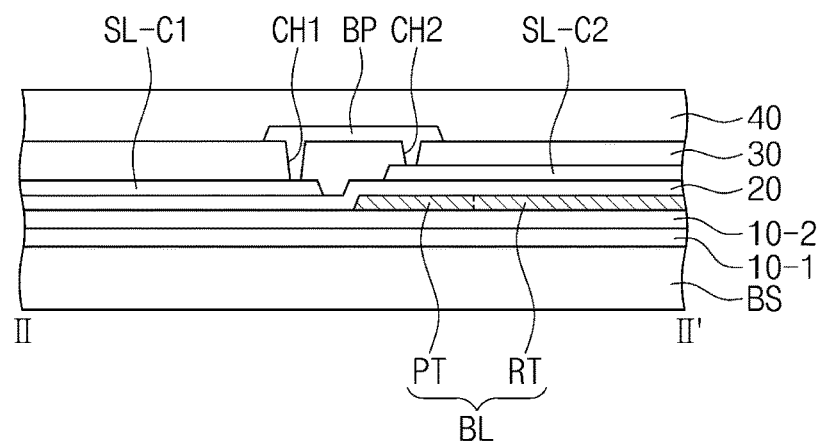
FIG. 7B is a cross-sectional view taken along line II-II' of FIG. 7A.

FIG. 7A is an enlarged view of region YY' illustrated in FIG. 6A. FIG. 7B is a cross-sectional view taken along line II-II' of FIG. 7A. FIG. 7B may include the same structure as the cross-sectional structure of FIG. 5C.

Referring to FIG. 7A and FIG. 7B, the hole pattern BL may include a central portion RT and a protruding portion PT. The central portion RT may at least partially surround the transmission region TA. The protruding portion PT may protrude from an edge BL-E of the hole pattern BL in one direction.

As illustrated in FIG. 4B, the scan lines SL are connected to the hole lines HG by passing through the hole pattern BL disposed in the hole line region HL. A portion of the scan lines SL passes through the edge BL-E of the hole pattern BL. Since the hole pattern BL and the scan lines SL are disposed on different layers, a step is formed in an edge BL-E portion of the hole pattern BL, and a disconnection of the scan lines SL overlapping the edge BL-E portion of the hole pattern BL may occur.

Any one of the scan lines SL may include a first scan line SL-C1 and a second scan line SL-C2. The first scan line SL-C1 and the second scan line SL-C2 may be disposed on the second insulation layer 20.

The first scan line SL-C1 may be spaced apart from the protruding portion PT disposed on the additional insulation layer 10-2. The second scan line SL-C2 is insulated from and at least partially overlaps the protruding portion PT and the central portion RT, and may be connected to a corresponding scan hole line among the scan hole lines 11G.

The display panel 210 (see FIG. 5B) may further include a bridge pattern BP disposed on the third insulation layer 30 and connecting the first scan line SL-C1 and the second scan line SL-C2 through contact holes CH1 and CH2 defined by penetrating the third insulation layer 30.

Therefore, since the scan lines SL-C1 and SL-C2 passing through a region overlapping the edge BL-E of the hole pattern BL among the scan lines SL are connected to the bridge pattern BP disposed on a different layer, a disconnection defect caused by a step formed by the hole pattern BL may be prevented. Accordingly, the electronic apparatus EA with increased reliability may be provided.

Figure 8:
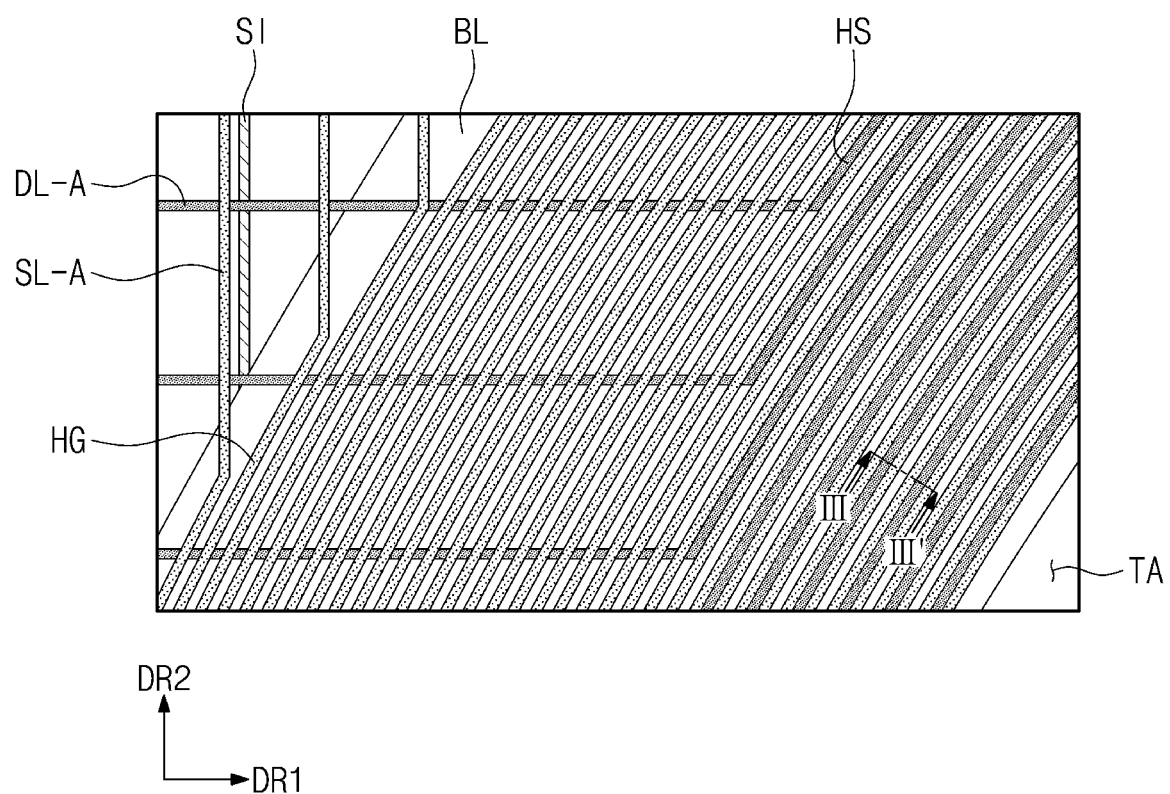
FIG. 8 is an enlarged view of a region adjacent to a hole line region according to an embodiment of the inventive concept.

FIG. 8 is an enlarged view of a region adjacent to a hole line region, according to an embodiment of the inventive concept. The same reference numerals may be used for the same/similar components as those of FIG. 1A to FIG. 7B, and to the extent that a detailed description of a particular element is omitted, it may be assumed that the element not described is at least similar to a corresponding element that has been described elsewhere within the specification.

Referring to FIG. 8, unlike what is illustrated in FIG. 6A, the pixels PX disposed in the same pixel row among the pixels PX (see FIG. 4B) disposed on the left/right side on the basis the transmission region TA may receive the same data signal as the pixels PX disposed in the same pixel row by a data line DL-A extended in the first direction DR1 and the data hole lines HS.

In addition, the pixels PX disposed in the same pixel column among the pixels PX disposed on the upper/lower side on the basis the transmission region TA may be turned on/off by the same scan signal by a scan line SL-A extended in the second direction DR2 and the scan hole line HG.

The data hole lines HS may be disposed on the second insulation layer 20 (see FIG. 6B), and the scan hole lines HG may be disposed on the third insulation layer 30 (see FIG. 6B).

Figure 9A:
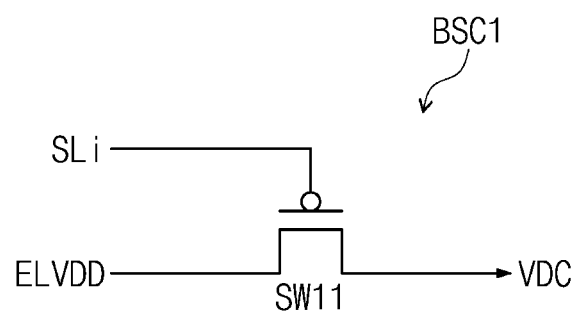
FIG. 9A is a circuit diagram of a hole pattern according to an embodiment of the inventive concept.
Figure 9B:
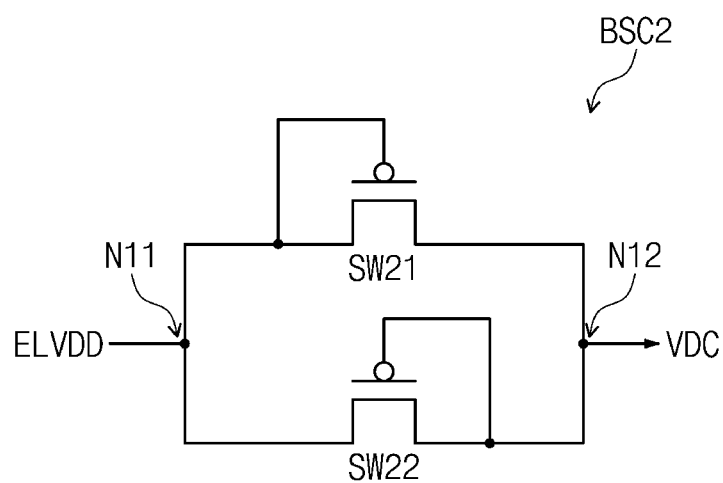
FIG. 9B is a circuit diagram of a hole pattern according to an embodiment of the inventive concept.
Figure 9C:
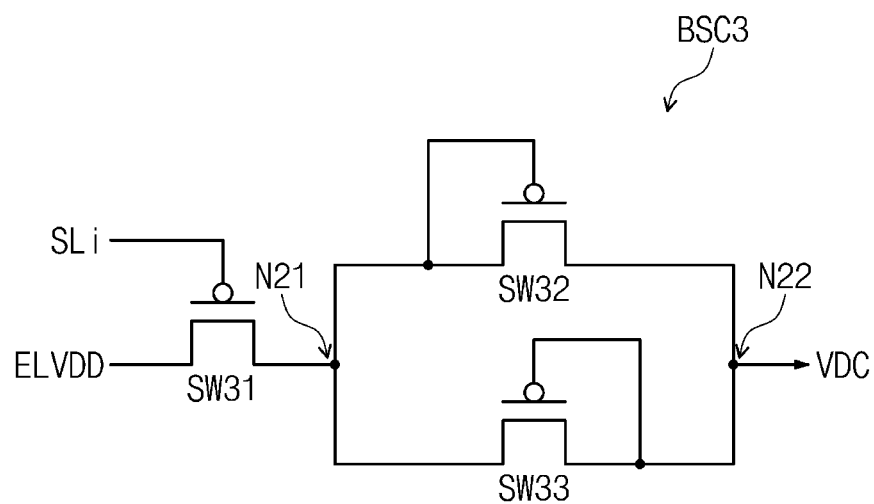
FIG. 9C is a circuit diagram of a hole pattern according to an embodiment of the inventive concept.
Figure 9D:
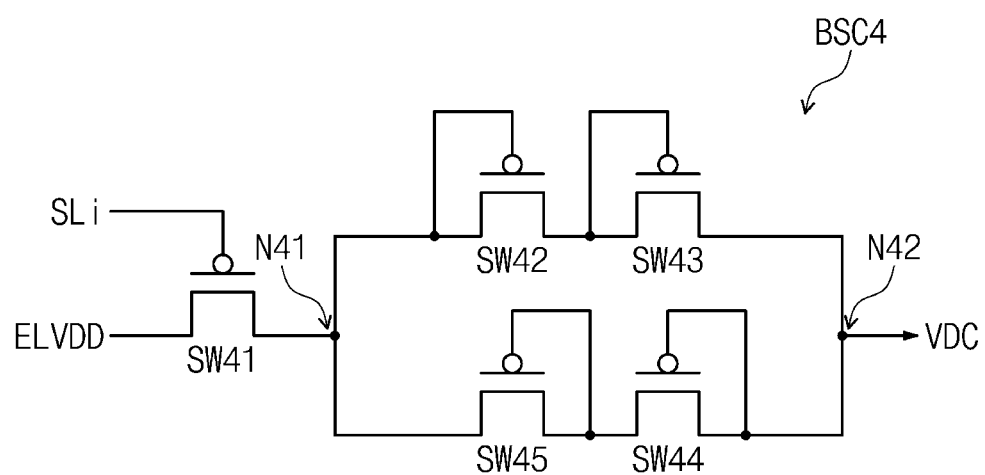
FIG. 9D is a circuit diagram of a hole pattern according to an embodiment of the inventive concept.

FIG. 9A is a circuit diagram of a hole pattern according to an embodiment of the inventive concept. FIG. 9B is a circuit diagram of a hole pattern according to an embodiment of the inventive concept. FIG. 9C is a circuit diagram of a hole pattern according to an embodiment of the inventive concept. FIG. 9D is a circuit diagram of a hole pattern according to an embodiment of the inventive concept. The same reference numerals may be used for the same/similar components as those of FIG. 1A to FIG. 7B, and to the extent that a detailed description of a particular element is omitted, it may be assumed that the element not described is at least similar to a corresponding element that has been described elsewhere within the specification.

The hole pattern signal VDC illustrated in FIG. 9A to FIG. 9D may be a voltage provided to the hole pattern BL through the hole control line SI illustrated in FIG. 5B. In addition, a power voltage ELVDD may correspond to the first voltage ELVDD provided to the pixels PX described with reference to FIG. 3.

Referring to FIG. 9A, a hole pattern control unit BSC1 receives the power voltage ELVDD, and may provide the hole pattern signal VDC to the hole pattern BL (see FIG. 5B) in response to a scan signal SLi.

The hole pattern control unit BSC1 includes a hole pattern transistor SW11 having a first electrode receiving the power voltage ELVDD, a second electrode outputting the hole pattern signal VDC, and a gate electrode receiving the scan signal SLi.

The scan signal SLi may be such that an initial scan signal is applied to the hole pattern BL once during one frame during which a pixel is driven, or a scan signal may be applied to the hole pattern BL for a plurality of times to maintain the capacitance between the hole pattern BL and the hole lines HS and HG.

Referring to FIG. 9B, a hole pattern control unit BSC2 receives the power voltage ELVDD, and may provide the hole pattern signal VDC to the hole pattern BL (see FIG. 5B).

The hole pattern control unit BSC2 includes a first hole pattern transistor SW21 and a second hole pattern transistor SW22.

The first hole pattern transistor SW21 includes a first electrode connected to a first node N11 receiving the power voltage ELVDD, a second electrode connected to a second node N12 outputting the hole pattern signal VDC, and a gate electrode connected to the first node N11.

The second hole pattern transistor SW22 includes a first electrode connected to a second node N12 a second electrode connected to the first node N11, and a gate electrode connected to the second node N12.

The hole pattern BL is not in a complete floating state while the pixel PX is being driven, and may be controlled within a $+/-v_{th}$ range of the power voltage ELVDD.

Referring to FIG. 9C, a hole pattern control unit BSC3 receives the power voltage ELVDD, and may provide the hole pattern signal VDC to the hole pattern BL (see FIG. 5B) in response to the scan signal SLi.

The hole pattern control unit BSC3 includes a first hole pattern transistor SW31, a second hole pattern transistor SW32, and a third hole pattern transistor SW33.

The first hole pattern transistor SW31 includes a first electrode receiving the power voltage ELVDD, a second electrode connected to a first node N21, and the gate electrode receiving the scan signal SLi.

The second hole pattern transistor SW32 includes a first electrode connected to the first node N21, a second electrode connected to the second node N22 outputting the hole pattern signal VDC, and a gate electrode connected to the first node N21.

The third hole pattern transistor SW33 includes a first electrode connected to the second node N22, a second electrode connected to a first node N21, and a gate electrode connected to the second node N22.

The power voltage ELVDD may be applied only for a limited time in one frame.

Referring to FIG. 9D, a hole pattern control unit BSC4 receives the power voltage ELVDD, and may provide the hole pattern signal VDC to the hole pattern BL (see FIG. 5B) in response to the scan signal SLi.

The hole pattern control unit BSC4 includes a first hole pattern transistor SW41, a second hole pattern transistor SW42, a third hole pattern transistor SW43, a fourth hole pattern transistor SW44, and a fifth hole pattern transistor SW45.

The first hole pattern transistor SW41 includes a first electrode receiving the power voltage ELVDD, a second electrode connected to a first node N41, and the gate electrode receiving the scan signal SLi.

The second hole pattern transistor SW42 includes a first electrode connected to a first node N41, a second electrode connected to the first electrode of the third hole pattern transistor SW43, and a gate electrode connected to a first node N41.

The third hole pattern transistor SW43 includes a first electrode connected to the second electrode of the second hole pattern transistor SW42, a second electrode connected to a second node N42, and a gate electrode connected to the second electrode of the second hole pattern transistor SW42 and the first electrode of the third hole pattern transistor SW43.

The fourth hole pattern transistor SW44 includes a first electrode connected to the second node N42, a second electrode connected to the first electrode of the fifth hole pattern transistor SW45, and a gate electrode connected to the second node N42.

The fifth hole pattern transistor SW45 includes a first electrode connected to the second electrode of the fourth hole pattern transistor SW44, a second electrode connected to the first node 41, and a gate electrode connected to the second electrode of the fourth hole pattern transistor SW44 and the first electrode of the fifth hole pattern transistor SW45.

However, the inventive concept is not necessarily limited thereto. A voltage applied to the hole pattern BL may a voltage applied to the light emission lines EL1 to ELn described with reference to FIG. 3, or the initialization voltage Vint, but the present invention is not necessarily limited to any one embodiment.

Figure 10A:
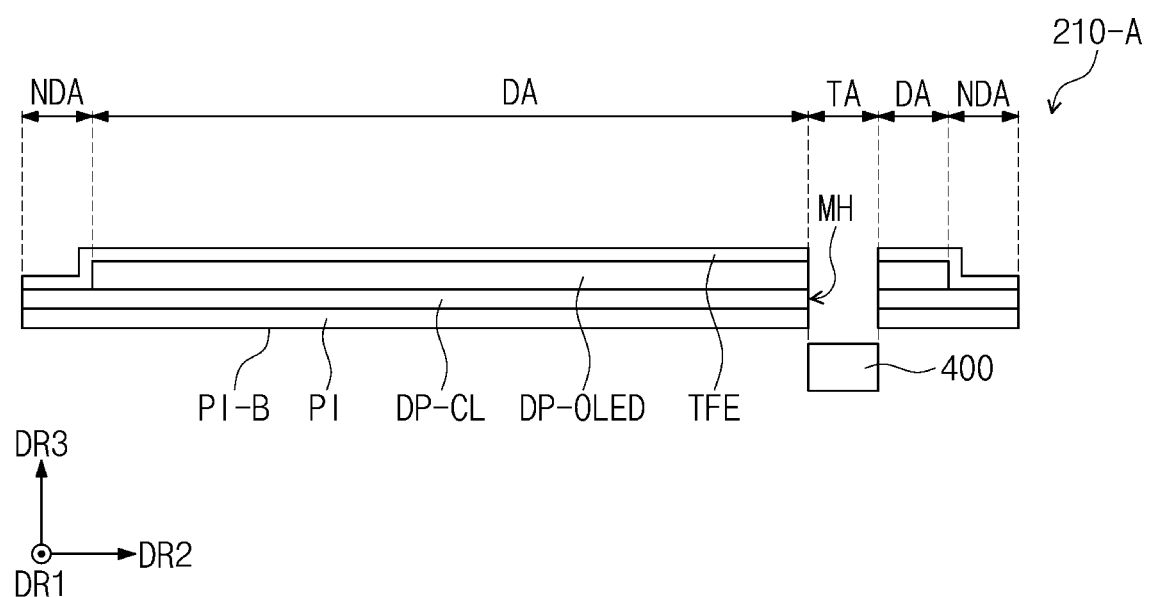
FIG. 10A is a cross-sectional view of a display panel according to an embodiment of the inventive concept.
Figure 10B:
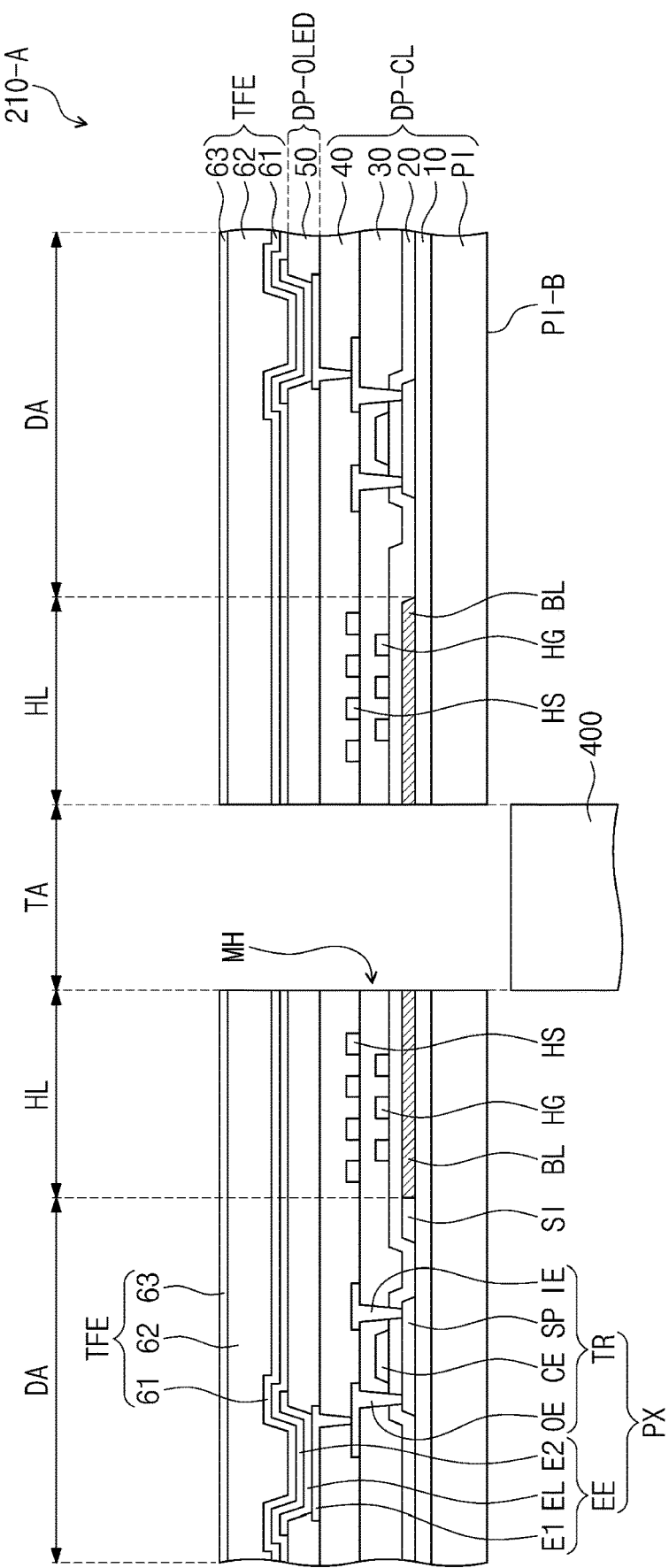
FIG. 10B is an enlarged cross-sectional view of one portion of a display panel according to an embodiment of the inventive concept.

FIG. 10A is a cross-sectional view of a display panel according to an embodiment of the inventive concept. FIG. 10B is an enlarged cross-sectional view of one portion of a display panel according to an embodiment of the inventive concept. The same reference numerals may be used for the same/similar components as those of FIG. 1A to FIG. 7B, and to the extent that a detailed description of a particular element is omitted, it may be assumed that the element not described is at least similar to a corresponding element that has been described elsewhere within the specification.

Referring to FIG. 10A and FIG. 10B, a display panel 210-A may include a base substrate PI, the circuit element layer DP-CL disposed on the base substrate PI, the display element layer DP-OLED disposed on the circuit element layer DP-CL, and an encapsulation substrate TFE.

The display panel 210-A may have a module hole MH defined therein. The module hole MH may be defined by physically penetrating the base substrate PI, the circuit element layer DP-CL, the display element layer DP-OLED, and the encapsulation layer TFE.

The module hole MH may be formed by at least partially overlapping the transmission region TA. Therefore, the disposition, shape, and number of the module hole MH may vary according to the disposition, shape, and number of the electronic module 400.

The base substrate PI may be flexible. The base substrate PI may include polyimide.

The electronic module 400 may be provided with light from the outside through the module hole MH.

The encapsulation layer TFE is disposed on the display element layer DP-OLED and encapsulates the display element layer DP-OLED.

The encapsulation layer TFE may have an integral shape extended from the display region DA to the non-display region NDA (see FIG. 4A). The encapsulation layer TFE may be commonly provided to the plurality of pixels PX (see FIG. 4A).

The encapsulation layer TFE may include a first inorganic layer 61, an organic layer 62, and a second inorganic layer 63 sequentially stacked along the third direction DR3. Each of the first inorganic layer 61, the organic layer 62, and the second inorganic layer 63 is illustrated as being a single layer. However, this is only exemplarily illustrated. At least one of the first inorganic layer 61, the organic layer 62, or the second inorganic layer 63 may be provided in plural or omitted, but the present invention is not necessarily limited to any one embodiment.

The first inorganic layer 61 may cover the second electrode E2. The first inorganic layer 61 may prevent external moisture or oxygen from penetrating into the light emitting element EL. For example, the first inorganic layer 61 may include a silicon nitride, a silicon oxide, or a compound thereof. The first inorganic layer 61 may be formed through a deposition process.

The organic layer 62 may be disposed on the first inorganic layer 61 and contact the first inorganic layer 61. The organic layer 62 may provide a flat surface on the first inorganic layer 61. For example, the organic layer 62 may provide a flat surface on the display region DA.

Bumps formed on an upper surface of the first inorganic layer 61, or particles present on the first inorganic layer 61 are covered by the organic layer 62 so that the surface state of the upper surface of the first inorganic layer 61 may be prevented from affecting components formed on the organic layer 62. In addition, the organic layer 62 may relieve stress between contacting layers. The organic layer 62 may include an organic material, and may be formed though a solution process such as spin coating, slit coating, and ink jet processes.

The second inorganic layer 63 is disposed on the organic layer 62 and covers the organic layer 62. The second inorganic layer 63 may be stably formed on a relatively flat surface than being disposed on the first inorganic layer 61. The second inorganic layer 63 encapsulates moisture and the like discharged from the organic layer 62 to prevent the moisture and the like to be introduced to the outside. The second inorganic layer 63 may include a silicon nitride, a silicon oxide, or a compound thereof. The second inorganic layer 63 may be formed through a deposition process.

The electronic module 400 at least partially overlaps the module hole MH, and is disposed on a lower portion PI-B of the base substrate PI. In the electronic module 400 which requires external light, the external light may be affected by diffraction and interference caused by the components of the circuit element layer DP-CL adjacent to the transmission region TA.

Since the hole pattern BL is adjacent to the transmission region TA and is disposed closer to the base substrate PI than the hole lines HG and HS are to the base substrate, it is possible to reduce the diffraction and interference of external light caused by the components of the circuit element layer DP-CL. Accordingly, an electronic apparatus with increased reliability may be provided.

Figure 11A:
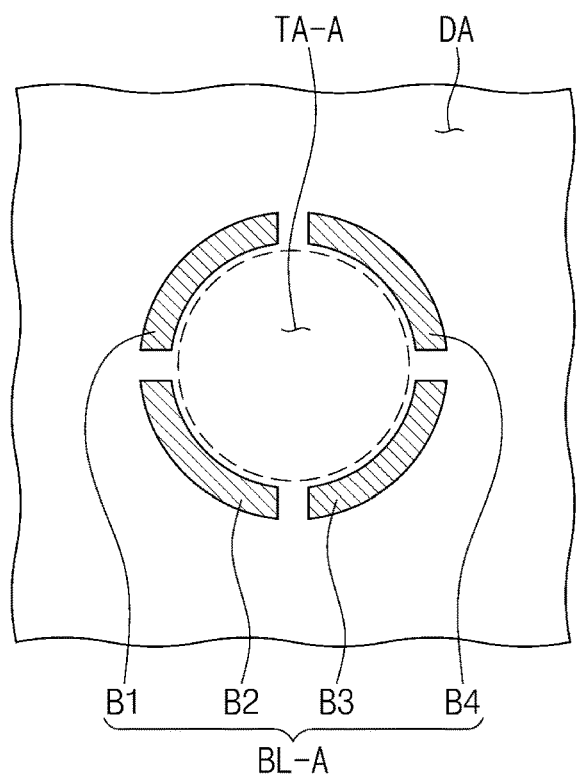
FIG. 11A is a plan view of a hole pattern according to an embodiment of the inventive concept.
Figure 11B:
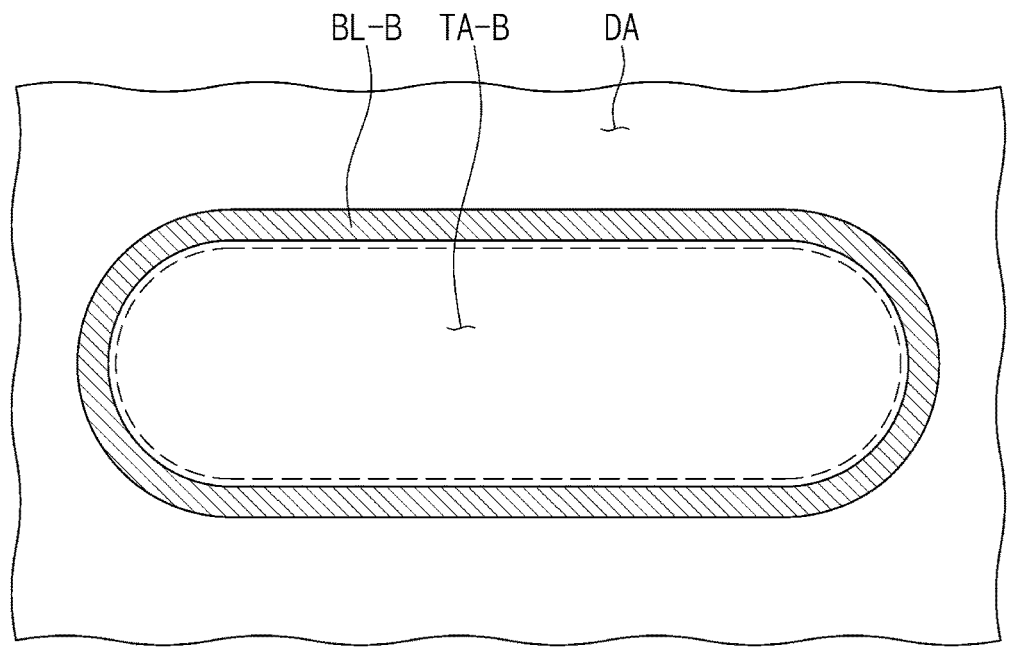
FIG. 11B is a plan view of a hole pattern according to an embodiment of the inventive concept.
Figure 11C:
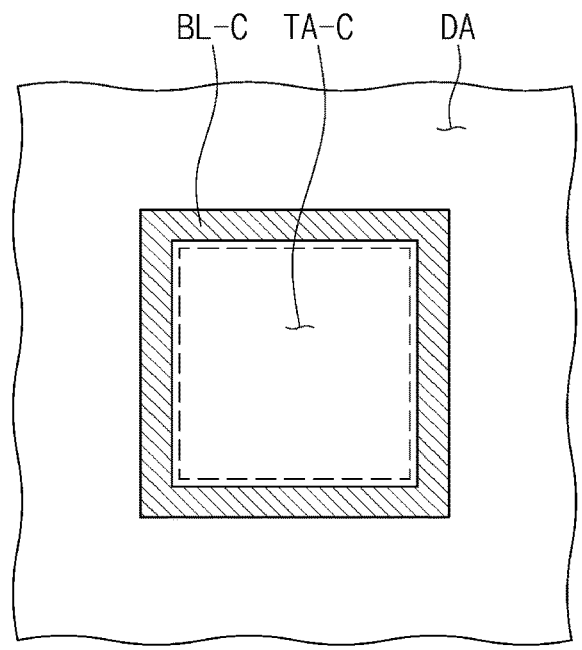
FIG. 11C is a plan view of a hole pattern according to an embodiment of the inventive concept.
Figure 11D:
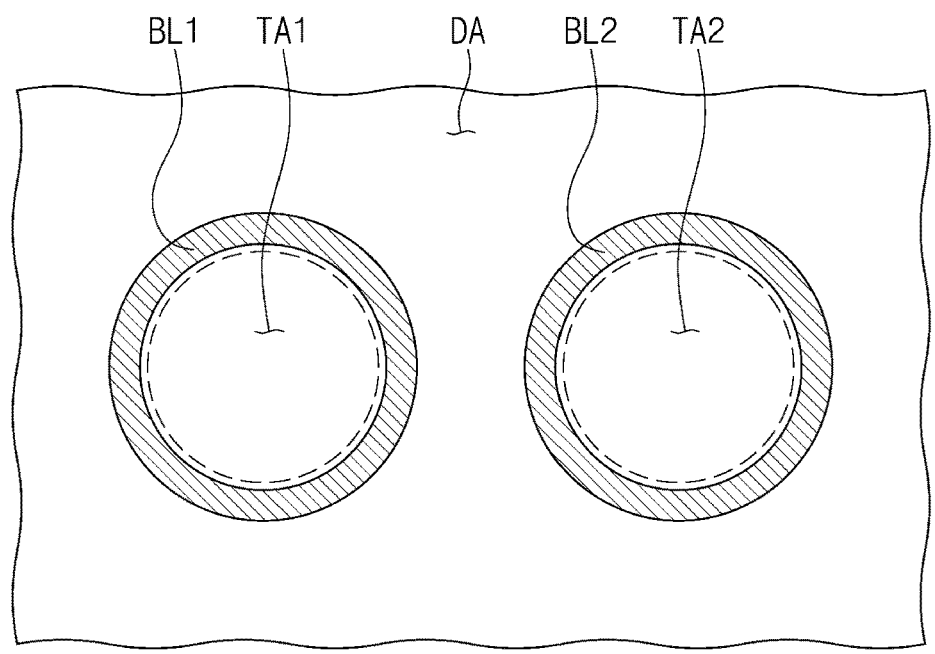
FIG. 11D is a plan view of a hole pattern according to an embodiment of the inventive concept.
Figure 11E:
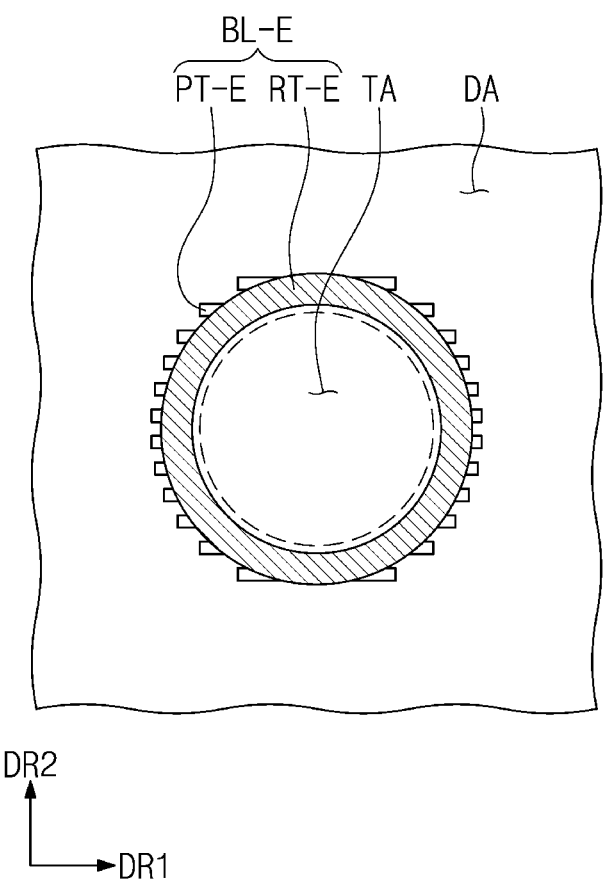
FIG. 11E is a plan view of a hole pattern according to an embodiment of the inventive concept.
Figure 11F:
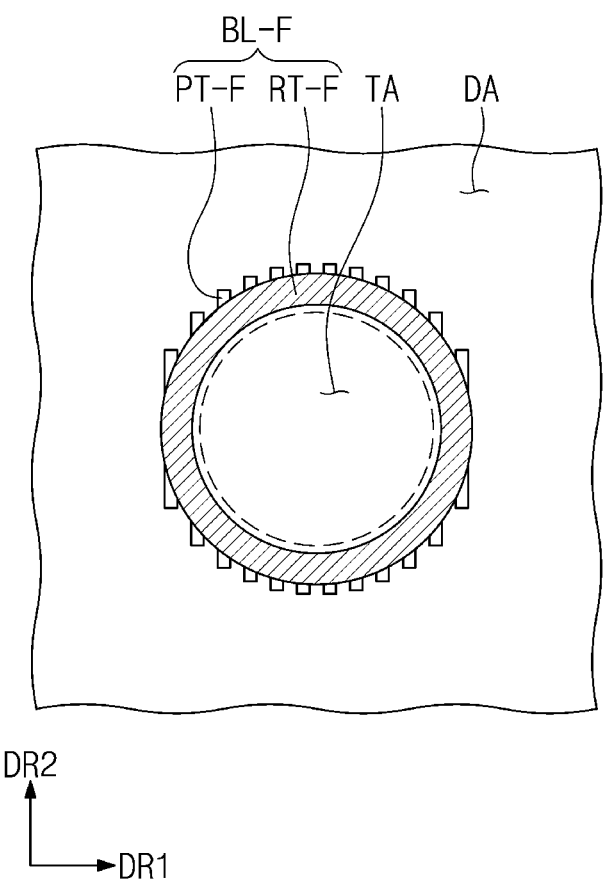
FIG. 11F is a plan view of a hole pattern according to an embodiment of the inventive concept.

FIG. 11A is a plan view of a hole pattern according to an embodiment of the inventive concept. FIG. 11B is a plan view of a hole pattern according to an embodiment of the inventive concept. FIG. 11C is a plan view of a hole pattern according to an embodiment of the inventive concept. FIG. 11D is a plan view of a hole pattern according to an embodiment of the inventive concept. FIG. 11E is a plan view of a hole pattern according to an embodiment of the inventive concept. FIG. 11F is a plan view of a hole pattern according to an embodiment of the inventive concept. The same reference numerals may be used for the same/similar components as those of FIG. 1A to FIG. 7B, and to the extent that a detailed description of a particular element is omitted, it may be assumed that the element not described is at least similar to a corresponding element that has been described elsewhere within the specification.

Referring to FIG. 11A, a hole pattern BL-A included in the display region DA may include a plurality of division patterns B1, B2, B3, and B4. The division patterns B1, B2, B3, and B4 may be spaced apart at a predetermined interval and at least partially surround a transmission region TA-A.

Each of the division patterns B1, B2, B3, and B4 may be insulated by any one of the insulation layers illustrated in FIG. 5B, and may be applied with different power voltages ELVDD, but the present invention is not necessarily limited to any one embodiment.

Referring to FIG. 11B, a hole pattern BL-B included in the display region DA may have an elliptical shape. The shape of the hole pattern BL-B is defined according to the shape of a transmission region TA-B, and the transmission region TA-B may be defined according to the shape and number of the electronic module 400 (see FIG. 1B).

Referring to FIG. 11C, a hole pattern BL-C included in the display region DA may have a quadrangular shape. The transmission region TA-C included in the hole pattern BL-C may also have a quadrangular shape. However, the inventive concept is not necessarily limited thereto. The hole pattern BL-C may have a polygonal shape, but is not necessarily limited to any one shape.

Referring to FIG. 11D, the hole patterns BL1 and BL2 may be provided in plural in the display region DA. The first hole pattern BL1 and the second hole pattern BL2 are spaced apart from each other, and may be applied with different voltages. The transmission regions TA1 and TA2 may also be provided in plural, within respective hole patterns BL1 and BL2. However, the inventive concept is not necessarily limited thereto. The first hole pattern BL1 and the second hole pattern BL2 may be applied with the same voltage.

Referring to FIG. 11E, the hole pattern BL-E may include a central portion RT-E and a plurality of protruding portions PT-E. The protruding portions PT-E may extend along one direction from the central portion RT-E.

The protruding portions PT-E may be disposed on the left/right side of the hole pattern BL-E on the basis of a central axis of the hole pattern BL-E extended along the second direction DR2. For example, the protruding portions PT-E may extend along the first direction DR1 on the basis of the central axis.

The protruding portions PT-E may extend in the same direction as the scan lines SL illustrated in FIG. 6A and be connected to the scan lines SL. Each of the protruding portions PT-E may be connected to a different hole control line (see FIG. 7A). Since the hole pattern BL-E are connected to different hole control lines from each other, a voltage may be applied continuously.

Referring to FIG. 11F, a hole pattern BL-F may include a central portion RT-F and a plurality of protruding portions PT-F. The protruding portions PT-F may extend along one direction from the central portion RT-F.

The protruding portions PT-F may be disposed on the upper/lower side of the hole pattern BL-F on the basis of a central axis of the hole pattern BL-F extended along the first direction DR1. For example, the protruding portions PT-F may extend along the second direction DR2 on the basis of the central axis.

The protruding portions PT-F may extend in the same direction as the scan lines SL-A illustrated in FIG. 8 and be connected to the scan lines SL-A. Each of the protruding portions PT-F may be connected to a different hole control line (see FIG. 8). Since the hole pattern BL-E is connected to different hole control lines from each other, a voltage may be applied continuously.

A hole pattern may be disposed in a transmission region at least partially overlapping an electronic module. Accordingly, since the hole pattern is disposed closer to a base substrate than hole lines are to the base substrate, a situation in which external light is reflected from an electronic module and then is re-incident on the electronic module through diffraction and/or interference may be prevented. Therefore, an electronic apparatus with increased reliability may be provided.

Although the inventive concept has been described with reference to various embodiments thereof, it will be understood by those skilled in the art that various modifications and changes in form and details may be made therein without departing from the spirit and scope of the present disclosure.

What is claimed is:
1. An electronic apparatus, comprising:
   a base substrate including a first region, a second region at least partially surrounded by the first region, and a display region at least partially surrounding the first region;

a plurality of pixels disposed on the base substrate, each of the plurality of pixels including a circuit element layer, including a transistor, and a display element layer, including a light emitting element connected to the transistor;

a plurality of hole lines connecting pixels of the plurality of pixels, wherein the second region is interposed between neighboring pixels of die plurality of pixels that are connected to each other by the plurality of hole lines; and a hole pattern electrically insulated from the plurality of hole lines, disposed in the first region, and at least partially surrounding the second region, wherein the hole pattern is a conductive pattern.

2. The electronic apparatus of claim 1, wherein each of the plurality of pixels receives a power voltage and is connected to both a scan line, transmitting a scan signal, and to a data line, transmitting a data signal.

3. The electronic apparatus of claim 2, further comprising a hole pattern control unit receiving the power voltage and provide a hole pattern signal to the hole pattern in response to the scan signal.

4. The electronic apparatus of claim 3, wherein the hole pattern control unit comprises a hole pattern transistor including a first electrode receiving the power voltage, a second electrode outputting the hole pattern signal, and a first gate electrode receiving the scan signal.

5. The electronic apparatus of claim 3, wherein the hole pattern control unit comprises:

a first hole pattern transistor including a third electrode receiving the power voltage, a fourth electrode connected to a first node, and a second gate electrode receiving the scan signal;

at least one second hole pattern transistor including a fifth electrode connected to the first node, a sixth electrode connected to a second node outputting the hole pattern signal, and a third gate electrode connected to the first node; and at least one third hole pattern transistor including a seventh electrode connected to the second node, an eight electrode connected to the first node, and a fourth gate electrode connected to the second node.

6. The electronic apparatus of claim 2, further comprising a hole pattern control unit receiving the power voltage and provide a hole pattern signal to the hole pattern.

7. The electronic apparatus of claim 6, wherein the hole pattern control unit comprises:

a first hole pattern transistor including a first electrode connected to a first node receiving the power voltage, a second electrode connected to a second node outputting the hole pattern signal, and a first gate electrode connected to the first node; and a second hole pattern transistor including a third electrode connected to the second node, a fourth electrode connected to the first node, and a second gate electrode connected to the second node.

8. The electronic apparatus of claim 2, wherein the plurality of hole lines comprise scan hole lines connected to the scan line, and data hole lines that are insulated, spaced apart from the scan hole lines, and connected to the data line, wherein the scan hole lines and the data hole lines are arranged in an alternating pattern.

9. The electronic apparatus of claim 8, wherein:

the circuit element layer comprises first to fourth insulation layers sequentially stacked on the base substrate; and the transistor comprises: a semiconductor pattern disposed on the first insulation layer; a control electrode disposed on the second insulation layer and insulated from and at least partially overlapping the semiconductor pattern;

an upper electrode disposed on the third insulation layer and insulated from and at least partially overlapping the control electrode; and an input electrode and an output electrode each disposed on the fourth insulation layer and connected to opposing sides of the semiconductor pattern through contact holes defined in each of the first to fourth insulation layers.

10. The electronic apparatus of claim 9, wherein the hole pattern is disposed below the plurality of hole lines, and is disposed on any one layer of the first insulation layer and the second insulation layer.

11. The electronic apparatus of claim 9, wherein:

the hole pattern comprises a central portion at least partially surrounding the second region and a protruding portion which protrudes in one direction from an edge of the hole pattern;

the scan line comprises a first scan line spaced apart from the protruding portion and a second scan line spaced apart from the first scan line, at least partially overlapping the protruding portion and the central portion, and connected to a corresponding scan hole line among the scan hole lines; and the circuit element layer further comprises a bridge pattern connecting the first scan line and the second scan line.

12. The electronic apparatus of claim 1, further comprising an electronic module at least partially overlapping the second region and disposed below the display region.

13. The electronic apparatus of claim 1, further comprising, an encapsulation substrate disposed on the display element layer, and a sealing member spaced apart from an edge of the display region and coupling the circuit element layer and the encapsulation substrate, wherein a gap is formed between the encapsulation substrate and the display element layer.

14. The electronic apparatus of claim 13, wherein the base substrate and the encapsulation substrate are rigid, and pixels of the plurality of pixels are omitted in a region of the base substrate overlapping the second region.

15. The electronic apparatus of claim 1, further comprising a first inorganic layer covering the display element layer, a second inorganic layer disposed on the first inorganic layer, and a thin film encapsulation layer, including an organic layer, disposed between the first inorganic layer and the second inorganic layer.

16. The electronic apparatus of claim 15, wherein the base substrate is flexible, and the electronic apparatus further includes: a module hole penetrating, the base substrate, the circuit element layer, the display element layer, and the thin film encapsulation layer, wherein the module hole at least partially overlaps the second region.

17. The electronic apparatus of claim 1, wherein the hole pattern has a circular shape, an elliptical shape, or a polygonal shape.

18. The electronic apparatus of claim 1, wherein the hole pattern comprises division patterns spaced apart from each other.

19. An electronic apparatus, comprising:

a base substrate including a display region and a non-display region adjacent to the display region, the display region including a first region and a second region at least partially surrounded by the first region and having a higher light transmittance than the first region;

a plurality of pixels disposed on the base substrate, each of the plurality of pixels receiving a power voltage, and each connected to a scan line transmitting a scan signal and a data line transmitting a data signal;

a plurality of hole lines connecting pixels of the plurality of pixels, wherein the second region is interposed between neighboring pixels of the plurality of pixels that are connected to each other by the plurality of hole lines; and a hole pattern insulted from and at least partially overlapping the plurality of hole lines and at least partially surrounding; the second region, wherein the hole pattern is spaced apart from the second region and is closer to the base substrate than the plurality of hole lines is to the base substrate, wherein the hole pattern is a conductive pattern.

20. The electronic apparatus of claim 19, further comprising a hole pattern control unit receiving the power voltage and provide a hole pattern signal to the bole pattern in response to the scan signal.

21. The electronic apparatus of claim 20, wherein the hole pattern control unit comprises:

a hole pattern transistor including a first electrode receiving the power voltage;

a second electrode outputting the hole pattern signal; and a gate electrode receiving the scan signal.

22. The electronic apparatus of claim 20, wherein the hole pattern control unit comprises:

a first hole pattern transistor including a first electrode receiving the power voltage, a second electrode connected to a first node, and a first gate electrode receiving the scan signal;

at least one second hole pattern transistor including a second electrode connected to the first node, a third electrode connected to a second node outputting the hole pattern signal, and a second gate electrode connected to the first node; and at least one third hole pattern transistor including a fourth electrode connected to the second node, a fifth electrode connected to the first node, and a third gate electrode connected to the second node.

23. The electronic apparatus of claim 19, further comprising a hole pattern control unit receiving the power voltage and provide a bole pattern signal to the hole pattern.

24. The electronic apparatus of claim 23, wherein the hole pattern control unit comprises:

a first bole pattern transistor including a first electrode connected to a first node receiving the power voltage, a second electrode connected to a second node outputting the hole pattern signal, and a first gate electrode connected to the first node; and a second hole pattern transistor including a third electrode connected to the second node, a fourth electrode connected to the first node, and a second gate electrode connected to the second node.

* * * * *